US011610365B2

(12) United States Patent
Jagannathan et al.

(10) Patent No.: US 11,610,365 B2
(45) Date of Patent: Mar. 21, 2023

(54) METHODS AND SYSTEMS FOR PROVISIONING A VIRTUAL EXPERIENCE OF A BUILDING BASED ON USER PROFILE DATA

(71) Applicants: Sunder Jagannathan, Coimbatore (IN); Vivek Agarwal, Faridabad (IN); Hitesh Singla, Gurgaon (IN); Sushant Kumar, Jamshedpur (IN)

(72) Inventors: Sunder Jagannathan, Coimbatore (IN); Vivek Agarwal, Faridabad (IN); Hitesh Singla, Gurgaon (IN); Sushant Kumar, Jamshedpur (IN)

(73) Assignee: SY Interiors Pvt. Ltd.

( * ) Notice: Subject to any disclaimer, the term of this patent is extended or adjusted under 35 U.S.C. 154(b) by 47 days.

(21) Appl. No.: 17/359,624

(22) Filed: Jun. 27, 2021

(65) Prior Publication Data
US 2022/0319108 A1 Oct. 6, 2022

(51) Int. Cl.
G06T 17/00 (2006.01)
G06F 16/9535 (2019.01)
(Continued)

(52) U.S. Cl.
CPC .............. G06T 17/00 (2013.01); G06F 3/013 (2013.01); G06F 3/04815 (2013.01);
(Continued)

(58) Field of Classification Search
CPC ......... G06T 17/00; G06T 13/40; G06F 3/013; G06F 3/04815; G06F 16/9535;
(Continued)

(56) References Cited

U.S. PATENT DOCUMENTS

| 10,540,730 | B2 | 1/2020 | Motta |
| 10,853,992 | B1 | 12/2020 | Zhu |
| 2008/0126206 | A1 | 5/2008 | Jarrell |
| 2009/0171240 | A1 | 7/2009 | Aguilar et al. |
| 2014/0337634 | A1* | 11/2014 | Starner ................. H04W 12/33 713/186 |

(Continued)

FOREIGN PATENT DOCUMENTS

| AU | 2018100585 A4 | 6/2018 |
| WO | 2005124584 A2 | 12/2005 |

(Continued)

Primary Examiner — Maurice L. McDowell, Jr.
(74) Attorney, Agent, or Firm — Dihraj Jindal; Patent Yogi LLC

(57) ABSTRACT

Disclosed herein is a method of provisioning a virtual experience of a building based on user preference. The method may include receiving an identity data associated with an identity of a user, retrieving a user profile data based on the identity data, analyzing the user profile data using a machine learning model, determining at least one preference data based on the analyzing, identifying at least one virtual utility object based on the at least one preference data, generating an interactive 3D model data comprising the at least one virtual utility object, transmitting the interactive 3D model data to a user device configured to present the interactive 3D model data, receiving a reaction data from the user device. Further, the user device may include at least one sensor configured to generate the reaction data based on a behavioral reaction of a user consuming the interactive 3D model data.

20 Claims, 23 Drawing Sheets

(51) Int. Cl.
*G06N 20/00* (2019.01)
*G06F 3/04815* (2022.01)
*G06T 13/40* (2011.01)
*G06F 3/01* (2006.01)
*G06V 40/16* (2022.01)
*G06V 40/18* (2022.01)
*H04L 67/306* (2022.01)
*G06F 30/13* (2020.01)

(52) U.S. Cl.
CPC ......... *G06F 16/9535* (2019.01); *G06N 20/00* (2019.01); *G06T 13/40* (2013.01); *G06V 40/172* (2022.01); *G06V 40/197* (2022.01); *G06F 30/13* (2020.01); *H04L 67/306* (2013.01)

(58) Field of Classification Search
CPC ...... G06F 30/13; G06N 20/00; G06V 40/172; G06V 40/197; H04L 67/306
See application file for complete search history.

(56) References Cited

U.S. PATENT DOCUMENTS

| | | |
|---|---|---|
| 2015/0324940 A1 | 11/2015 | Samson et al. |
| 2016/0110916 A1 | 4/2016 | Eikhoff et al. |
| 2016/0300392 A1 | 10/2016 | Jonczyk et al. |
| 2017/0140484 A1 | 5/2017 | Lete et al. |
| 2019/0287164 A1 | 9/2019 | Eraker et al. |
| 2019/0362545 A1* | 11/2019 | Pejic .................. G06F 30/12 |
| 2020/0312029 A1 | 10/2020 | Heinen et al. |
| 2021/0019453 A1 | 1/2021 | Yang et al. |
| 2021/0073449 A1* | 3/2021 | Segev ................... G06F 30/20 |
| 2021/0117071 A1* | 4/2021 | Gharpuray ............. G06T 19/00 |
| 2021/0334538 A1* | 10/2021 | Marotta ................ G06T 19/006 |

FOREIGN PATENT DOCUMENTS

| | | |
|---|---|---|
| WO | 2011008236 A1 | 1/2011 |
| WO | 2015127534 A1 | 9/2015 |
| WO | 2018140656 A1 | 8/2018 |
| WO | 2019058266 A1 | 3/2019 |

* cited by examiner

METHODS AND SYSTEMS FOR PROVISIONING A VIRTUAL EXPERIENCE OF A BUILDING BASED ON USER PROFILE DATA

CROSS REFERENCE TO RELATED APPLICATIONS

The present application claims a priority to an Indian Non-Provisional Patent application number IN202111015036, filed on Mar. 31, 2021 entitled "METHODS AND SYSTEMS FOR PROVISIONING A VIRTUAL EXPERIENCE OF A BUILDING BASED ON USER PROFILE DATA" and assigned to SY Interiors Pvt. Ltd., B-3/96, Safdarjung Enclave, New Delhi—110029, Delhi, India, which is hereby incorporated in its entirety.

FIELD OF THE INVENTION

Generally, the present disclosure relates to the field of data processing. More specifically, the present disclosure relates to methods, systems, apparatuses and devices for provisioning a virtual experience of a building based on user profile data.

BACKGROUND OF THE INVENTION

The field of generating virtual experiences to help visualize spaces is technologically important to several industries, business organizations and/or individuals.

Existing techniques for generating 3D virtual experiences based on 2D input data are deficient with regard to several aspects. For instance, current technologies are limited to quality of renders and do not provide interactive viewing capabilities for marketing activities. Furthermore, manual effort is required to generate 3D virtual experiences based on 2D input data. This is an expensive, a time consuming and an error prone task. Moreover, current technologies are heavily dependent on specialized hardware like 3D depth cameras to create virtual experiences.

Further, existing techniques of delivering 3D virtual experiences on user devices with limited resources are deficient with regard to several aspects. For instance, current technologies take considerable time to transmit and present 3D virtual experiences on user devices with limited resources.

Therefore, there is a need for improved methods, systems, apparatuses and devices for provisioning a virtual experience of a building based on user profile data with limited resources that may overcome one or more of the above-mentioned problems and/or limitations.

SUMMARY OF THE INVENTION

This summary is provided to introduce a selection of concepts in a simplified form, that are further described below in the Detailed Description. This summary is not intended to identify key features or essential features of the claimed subject matter. Nor is this summary intended to be used to limit the claimed subject matter's scope.

Disclosed herein is a method of provisioning a virtual experience of a building based on user preference. The method may include receiving, using a processing device, an identity data associated with an identity of a user. Further, the method may include retrieving, using a storage device, a user profile data based on the identity data. Further, the method may include analyzing, using the processing device, the user profile data using a machine learning model. Further, the method may include determining, using the processing device, at least one preference data based on the analyzing. Further, the method may include identifying, using the processing device, at least one virtual utility object based on the at least one preference data. Further, the method may include generating, using the processing device, an interactive 3D model data comprising the at least one virtual utility object. Further, the method may include transmitting, using a communication device, the interactive 3D model data to a user device configured to present the interactive 3D model data. Further, the method may include receiving, using the communication device, a reaction data from the user device. Further, the user device may include at least one sensor configured to generate the reaction data based on a behavioral reaction of a user consuming the interactive 3D model data. Further, the generating may include updating the interactive 3D model data based on the reaction data.

Further disclosed herein is a system for provisioning a virtual experience of a building based on user preference. The system may include a processing device, a communication device and a storage device. The processing device may be configured for receiving an identity data associated with an identity of a user. Further, the processing device may be configured for analyzing a user profile data using a machine learning model. Further, the processing device may be configured for determining at least one preference data based on the analyzing. Further, the processing device may be configured for identifying at least one virtual utility object based on the at least one preference data. Further, the processing device may be configured for generating an interactive 3D model data comprising the at least one virtual utility object. Further, the storage device may be configured for retrieving the user profile data based on the identity data. Further, the communication device may be configured for transmitting the interactive 3D model data to a user device configured to present the interactive 3D model data. Further, the communication device may be configured for receiving a reaction data from the user device. Further, the user device may include at least one sensor configured to generate the reaction data based on a behavioral reaction of a user consuming the interactive 3D model data. Further, the generating may include updating the interactive 3D model data based on the reaction data.

Both the foregoing summary and the following detailed description provide examples and are explanatory only. Accordingly, the foregoing summary and the following detailed description should not be considered to be restrictive. Further, features or variations may be provided in addition to those set forth herein. For example, embodiments may be directed to various feature combinations and sub-combinations described in the detailed description.

BRIEF DESCRIPTION OF THE DRAWINGS

The accompanying drawings, which are incorporated in and constitute a part of this disclosure, illustrate various embodiments of the present disclosure. The drawings contain representations of various trademarks and copyrights owned by the Applicants. In addition, the drawings may contain other marks owned by third parties and are being used for illustrative purposes only. All rights to various trademarks and copyrights represented herein, except those belonging to their respective owners, are vested in and the property of the applicants. The applicants retain and reserve all rights in their trademarks and copyrights included herein, and grant permission to reproduce the material only in connection with reproduction of the granted patent and for no other purpose.

Furthermore, the drawings may contain text or captions that may explain certain embodiments of the present disclosure. This text is included for illustrative, non-limiting, explanatory purposes of certain embodiments detailed in the present disclosure.

DETAIL DESCRIPTIONS OF THE INVENTION

Figure 1:
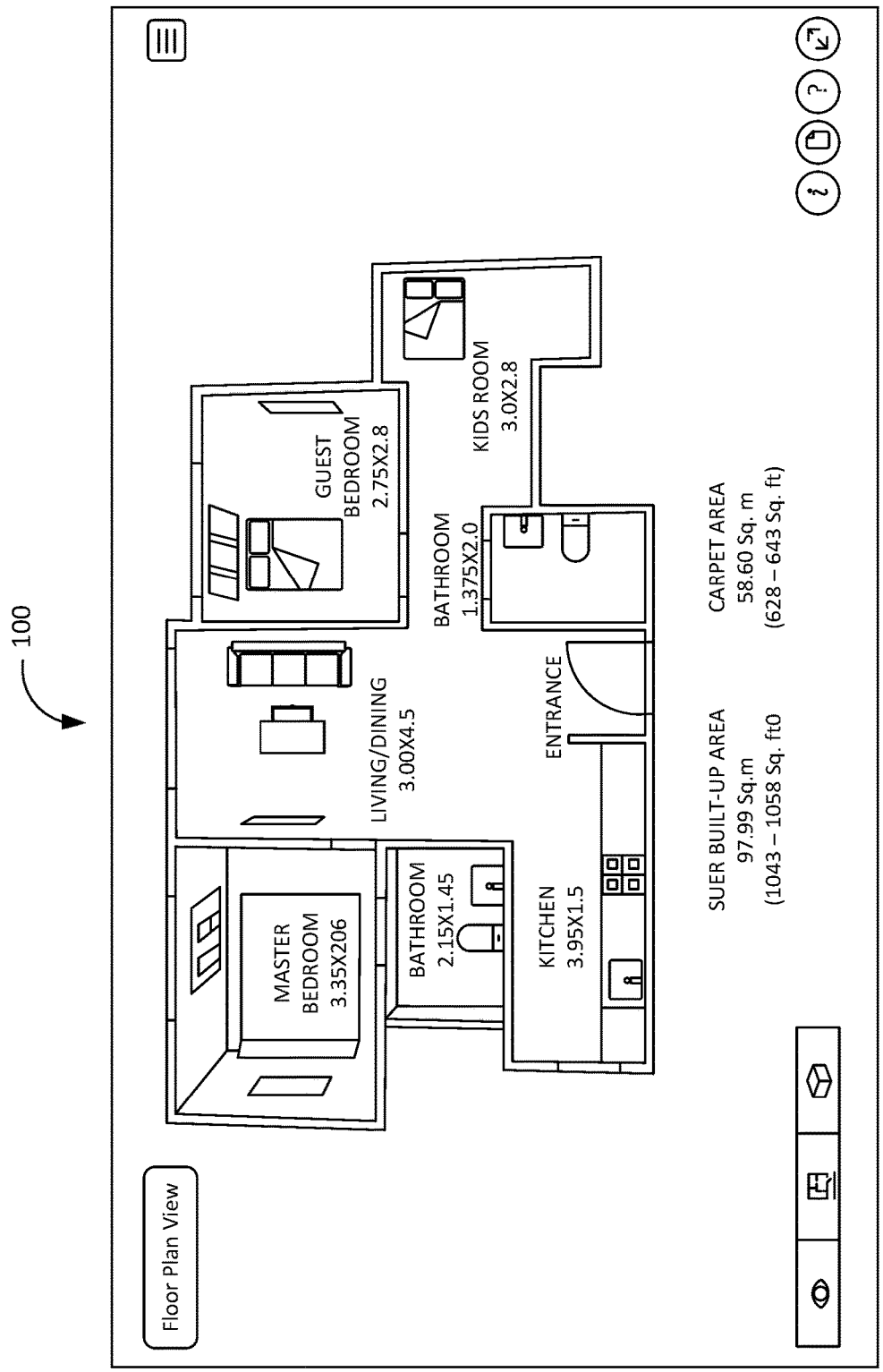
FIG. 1 is a user interface showing a floor plan view (2D), in accordance with some embodiments.

As a preliminary matter, it will readily be understood by one having ordinary skill in the relevant art that the present disclosure has broad utility and application. As should be understood, any embodiment may incorporate only one or a plurality of the above-disclosed aspects of the disclosure and may further incorporate only one or a plurality of the above-disclosed features. Furthermore, any embodiment discussed and identified as being "preferred" is considered to be part of a best mode contemplated for carrying out the embodiments of the present disclosure. Other embodiments also may be discussed for additional illustrative purposes in providing a full and enabling disclosure. Moreover, many embodiments, such as adaptations, variations, modifications, and equivalent arrangements, will be implicitly disclosed by the embodiments described herein and fall within the scope of the present disclosure.

Accordingly, while embodiments are described herein in detail in relation to one or more embodiments, it is to be understood that this disclosure is illustrative and exemplary of the present disclosure, and are made merely for the purposes of providing a full and enabling disclosure. The detailed disclosure herein of one or more embodiments is not intended, nor is to be construed, to limit the scope of patent protection afforded in any claim of a patent issuing here from, which scope is to be defined by the claims and the equivalents thereof. It is not intended that the scope of patent protection be defined by reading into any claim limitation found herein and/or issuing here from that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present disclosure. Accordingly, it is intended that the scope of patent protection is to be defined by the issued claim(s) rather than the description set forth herein.

Additionally, it is important to note that each term used herein refers to that which an ordinary artisan would understand such term to mean based on the contextual use of such term herein. To the extent that the meaning of a term used herein—as understood by the ordinary artisan based on the contextual use of such term—differs in any way from any particular dictionary definition of such term, it is intended that the meaning of the term as understood by the ordinary artisan should prevail.

Furthermore, it is important to note that, as used herein, "a" and "an" each generally denotes "at least one," but does not exclude a plurality unless the contextual use dictates otherwise. When used herein to join a list of items, "or" denotes "at least one of the items," but does not exclude a plurality of items of the list. Finally, when used herein to join a list of items, "and" denotes "all of the items of the list."

The following detailed description refers to the accompanying drawings. Wherever possible, the same reference numbers are used in the drawings and the following description to refer to the same or similar elements. While many embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the claims found herein and/or issuing here from. The present disclosure contains headers. It should be understood that these headers are used as references and are not to be construed as limiting upon the subjected matter disclosed under the header.

The present disclosure includes many aspects and features. Moreover, while many aspects and features relate to, and are described in the context of provisioning a virtual experience of a building based on user profile data, embodiments of the present disclosure are not limited to use only in this context.

In general, the method disclosed herein may be performed by one or more computing devices. For example, in some embodiments, the method may be performed by a server computer in communication with one or more client devices over a communication network such as, for example, the Internet. In some other embodiments, the method may be performed by one or more of at least one server computer, at least one client device, at least one network device, at least one sensor and at least one actuator. Examples of the one or more client devices and/or the server computer may include, a desktop computer, a laptop computer, a tablet computer, a personal digital assistant, a portable electronic device, a wearable computer, a smart phone, an Internet of Things (IoT) device, a smart electrical appliance, a video game console, a rack server, a super-computer, a mainframe computer, mini-computer, micro-computer, a storage server, an application server (e.g. a mail server, a web server, a real-time communication server, an FTP server, a virtual server, a proxy server, a DNS server etc.), a quantum computer, and so on. Further, one or more client devices and/or the server computer may be configured for executing a software application such as, for example, but not limited to, an operating system (e.g. Windows, Mac OS, Unix, Linux, Android, etc.) in order to provide a user interface (e.g. GUI, touch-screen based interface, voice based interface, gesture based interface etc.) for use by the one or more users and/or a network interface for communicating with other devices over a communication network. Accordingly, the server computer may include a processing device configured for performing data processing tasks such as, for example, but not limited to, analyzing, identifying, determining, generating, transforming, calculating, computing, compressing, decompressing, encrypting, decrypting, scrambling, splitting, merging, interpolating, extrapolating, redacting, anonymizing, encoding and decoding. Further, the server computer may include a communication device configured for communicating with one or more external devices. The one or more external devices may include, for example, but are not limited to, a client device, a third party database, public database, a private database and so on. Further, the communication device may be configured for communicating with the one or more external devices over one or more communication channels. Further, the one or more communication channels may include a wireless communication channel and/or a wired communication channel. Accordingly, the communication device may be configured for performing one or more of transmitting and receiving of information in electronic form. Further, the server computer may include a storage device configured for performing data storage and/or data retrieval operations. In general, the storage device may be configured for providing reliable storage of digital information. Accordingly, in some embodiments, the storage device may be based on technologies such as, but not limited to, data compression, data backup, data redundancy, deduplication, error correction, data fingerprinting, role based access control, and so on.

Further, one or more steps of the method disclosed herein may be initiated, maintained, controlled and/or terminated based on a control input received from one or more devices operated by one or more users such as, for example, but not limited to, an end user, an admin, a service provider, a service consumer, an agent, a broker and a representative thereof. Further, the user as defined herein may refer to a human, an animal or an artificially intelligent being in any state of existence, unless stated otherwise, elsewhere in the present disclosure. Further, in some embodiments, the one or more users may be required to successfully perform authentication in order for the control input to be effective. In general, a user of the one or more users may perform authentication based on the possession of a secret human readable secret data (e.g. username, password, passphrase, PIN, secret question, secret answer etc.) and/or possession of a machine readable secret data (e.g. encryption key, decryption key, bar codes, etc.) and/or or possession of one or more embodied characteristics unique to the user (e.g. biometric variables such as, but not limited to, fingerprint, palm-print, voice characteristics, behavioral characteristics, facial features, iris pattern, heart rate variability, evoked potentials, brain waves, and so on) and/or possession of a unique device (e.g. a device with a unique physical and/or chemical and/or biological characteristic, a hardware device with a unique serial number, a network device with a unique IP/MAC address, a telephone with a unique phone number, a smart-card with an authentication token stored thereupon, etc.). Accordingly, the one or more steps of the method may include communicating (e.g. transmitting and/or receiving) with one or more sensor devices and/or one or more actuators in order to perform authentication. For example, the one or more steps may include receiving, using the communication device, the secret human readable data from an input device such as, for example, a keyboard, a keypad, a touch-screen, a microphone, a camera and so on. Likewise, the one or more steps may include receiving, using the communication device, the one or more embodied characteristics from one or more biometric sensors.

Further, one or more steps of the method may be automatically initiated, maintained and/or terminated based on one or more predefined conditions. In an instance, the one or more predefined conditions may be based on one or more contextual variables. In general, the one or more contextual variables may represent a condition relevant to the performance of the one or more steps of the method. The one or more contextual variables may include, for example, but are not limited to, location, time, identity of a user associated with a device (e.g. the server computer, a client device etc.) corresponding to the performance of the one or more steps, environmental variables (e.g. temperature, humidity, pressure, wind speed, lighting, sound, etc.) associated with a device corresponding to the performance of the one or more steps, physical state and/or physiological state and/or psychological state of the user, physical state (e.g. motion, direction of motion, orientation, speed, velocity, acceleration, trajectory, etc.) of the device corresponding to the performance of the one or more steps and/or semantic content of data associated with the one or more users. Accordingly, the one or more steps may include communicating with one or more sensors and/or one or more actuators associated with the one or more contextual variables. For example, the one or more sensors may include, but are not limited to, a timing device (e.g. a real-time clock), a location sensor (e.g. a GPS receiver, a GLONASS receiver, an indoor location sensor etc.), a biometric sensor (e.g. a fingerprint sensor), an environmental variable sensor (e.g. temperature sensor, humidity sensor, pressure sensor, etc.) and a device state sensor (e.g. a power sensor, a voltage/current sensor, a switch-state sensor, a usage sensor, etc. associated with the device corresponding to performance of the one or more steps).

Further, the one or more steps of the method may be performed one or more number of times. Additionally, the one or more steps may be performed in any order other than as exemplarily disclosed herein, unless explicitly stated otherwise, elsewhere in the present disclosure. Further, two or more steps of the one or more steps may, in some embodiments, be simultaneously performed, at least in part. Further, in some embodiments, there may be one or more time gaps between performance of any two steps of the one or more steps.

Further, in some embodiments, the one or more predefined conditions may be specified by the one or more users. Accordingly, the one or more steps may include receiving, using the communication device, the one or more predefined conditions from one or more and devices operated by the one or more users. Further, the one or more predefined conditions may be stored in the storage device. Alternatively, and/or additionally, in some embodiments, the one or more predefined conditions may be automatically determined, using the processing device, based on historical data corresponding to performance of the one or more steps. For example, the historical data may be collected, using the storage device, from a plurality of instances of performance of the method. Such historical data may include performance actions (e.g. initiating, maintaining, interrupting, terminating, etc.) of the one or more steps and/or the one or more contextual variables associated therewith. Further, machine learning may be performed on the historical data in order to determine the one or more predefined conditions. For instance, machine learning on the historical data may determine a correlation between one or more contextual variables and performance of the one or more steps of the method. Accordingly, the one or more predefined conditions may be generated, using the processing device, based on the correlation.

Further, one or more steps of the method may be performed at one or more spatial locations. For instance, the method may be performed by a plurality of devices interconnected through a communication network. Accordingly, in an example, one or more steps of the method may be performed by a server computer. Similarly, one or more steps of the method may be performed by a client computer. Likewise, one or more steps of the method may be performed by an intermediate entity such as, for example, a proxy server. For instance, one or more steps of the method may be performed in a distributed fashion across the plurality of devices in order to meet one or more objectives. For example, one objective may be to provide load balancing between two or more devices. Another objective may be to restrict a location of one or more of an input data, an output data and any intermediate data therebetween corresponding to one or more steps of the method. For example, in a client-server environment, sensitive data corresponding to a user may not be allowed to be transmitted to the server computer. Accordingly, one or more steps of the method operating on the sensitive data and/or a derivative thereof may be performed at the client device.

Overview:

The present disclosure describes a creation tool for provisioning a virtual experience of a building. The creation tool may provide a no code platform for creating immersive experiences. The creation tool may allow for drag and drop based creation of VR/AR using 2D floor plans and/or 360 degree images of a real property. The creation tool may employ an auto input and virtual tour creation algorithm. Therefore, with one click to create a virtual tour, the creation tool may start creating the virtual tour, and based on room data and connection points data, the creation tool is able to create a connected virtual tour in few minutes rather than hours. The creation tool may also provide a final web link for the user to check the virtual tour experience.

Further, the present disclosure describes a showcase tool for provisioning a virtual experience of a building. The showcase tool may enable video and voice calls for remote site visits.

Further, the present disclosure describes a method for 2D to 3D AI based conversion. The method may include transforming a floorplan to an interactive 3D walkthrough. The method may generate a rendering pipeline. The method may convert images (or PDF or DWG) into interactive 3D walkthroughs for VR. Further, the method may provide no code platforms for drag and drop VR and AR creation. Further, the method may employ AI and ML algorithms, including OCR, to detect walls, floors, doors, and furniture from a floor plan image. The method may enable the fastest and the most affordable 3D experience for interiors. The method may enable creation of interactive 3D walkthroughs within hours instead of weeks. This leads to low cost to a company allowing discounted prices for customers. The method may provide high quality 3D experience for customers' understanding. This helps in a better understanding of real estate interior floorplans. The method may extend real estate capabilities to visualize all of the floorplans. The method may employ real time ray tracing based rendering (Unreal engine workflow) to generate interactive photorealistic 3D VR walkthroughs. Further, the method may provide one click conversion of 360 images into an interactive VR walkthrough. Further, the method may provide one click approach to automatic placement of lighting in the 3D engine based on inputs from project location details on a portal. This may help in understanding a floor plan furniture population for a 3D walkthrough based on portal information of project location, user location, and user inputs. According to further embodiments, the method may provide one click floor plan identification from image (PDF or DWG) files.

According to further embodiments, the method may automatically detect one or more features from the floorplan, wherein the one or more features may include walls, wall layout, angles, connecting points, door positions, door opening direction, window type and positions, furniture layout, furniture type, furniture position, furniture rotation, bathroom fittings estimation size and type, modular kitchen estimation of type and size, wardrobe estimation of type and size, text detection of individual rooms, size detection from a text (if text available), size estimation by scaled models from a library of pre-trained models from 1 million floorplan database (if text not available), flooring type, and overall room sizes.

According to further embodiments, the method may receive one or more user inputs from a user on project information. Further, the method may obtain details from machine learned models of data points (over 1 million) from an integrated portal. The one or more user inputs may be related to a style of furniture, such as affordable, luxury, modern, Scandinavian, etc. Further, the one or more user inputs may be related to a cost of a home, such as USD 20,000-USD 2M. Further, the one or more user inputs may be related to a window type, such as French, standard, fully open, etc. Further, the one or more user inputs may be related to project name and location, such as getting location details and project details from the server side. Further, the method may fetch data points detected from floor plans and data points from the portal and user data points, and process through AI models for the construction of a 3D model.

Based on the data received from floorplans, the method may include converting the detected data automatically into JSON format and transferring the data points in an array that may be sent to the server side 3D application for creating the block view, placing doors in the right orientation, and creating open holes in 3D for window positions.

Based on the data received from user inputs (such as style of furniture, cost of a home, window type, and location of the project), the method may include automatically categorizing the furniture from a library along with inputs, and placing the furniture based on its orientation and received rotation data.

Based on the data received from portal data, the method may include determining the type of interiors, floorplan sizes, and type of home. This helps in creating the 3D views based on the 2D floor plan with better accuracy. The portal data may include over 1 million floorplan data, location, and project data.

Further, the method may include converting a 2D floor plan into a 3D model with a furniture population, based on the above inputs. Once the 3D model is created, the method may include using an automated lighting system for Real Time Ray Tracing Technology on Unreal engine software, to create advanced lighting in the environment. Based on the location details, and the project building orientation, the lights may be placed appropriately into the 3D scene. The process that generally takes around 3 hours to do, is done in minutes using the disclosed methods.

Now that the 3D model, lighting, and materials, textures are already ready, the model may prompt the operator for a final check and go ahead. Once the operator gives go ahead, it may start rendering the scene using Real time ray tracing of NVIDIA™, on a cloud and creates photorealistic 360 scenes for each room and exports for a walkthrough creation.

Further, the present disclosure describes a method for creating a digital twin of physical spaces. The method may not rely on any specific hardware. The method may enable users to perform measurements of various surfaces in the physical spaces.

Further, the present disclosure describes a method for providing 3D exterior views of buildings. The method may employ Web GL based solutions for optimized load for a high end 3D. The method may offer the first approach to create a platform for web3D experience with collaboration for real estate experience. Further, the method may provide an interactive experience with day and night views created entirely on the web. Further, the method may provide multi-platform output by an easy drag and drop tool. The method may provide the fastest and the most affordable 3D experience for exterior views of the buildings. The WebGL based 3D real estate experiences provide real-time rendering of the 3D VR walkthrough on a browser. Further, the method may provide the world's fastest real estate sales application load on a browser, using optimization and Web GL methods. Further, the method may provide showcasing complete real estate details in a 3D showcase application on web, mobile, and VR devices. Further, the method may provide automatic scene rotation of 3D based on a user's position detected from smart glass sensors. Further, the method may provide an automatic population of project surroundings based on project location and information from google maps, portal information on surroundings, and amenities. Further, the method may provide an automatic integration of unit inventory based on data from government websites and portals, to showcase available, reserved, and sold inventory. Further, the method may provide WebGL optimized and rendered models for a real estate project for mobile and web viewing experience.

Further, the present disclosure describes a collaborative sales tool. The collaborative sales tool enables a sales person to provide guided VR tours (using video/voice/chat) to multiple users where each user has control of a position/viewpoint within the VR walkthrough. Further, the collaborative sales tool enables the sales person to control the position/viewpoint of each of the users within the VR walkthrough according to the position/viewpoint of the sales person (i.e. guided mode). Further, the collaborative sales tool enables presenting a current location of each user in relation to the 3D walkthrough to the salesperson. Further, the collaborative sales tool may enable a sales person to provide guided VR tours (using video/voice/chat) to multiple users where each user has control of position/viewpoint within the VR walkthrough. Further, the collaborative sales tool may enable the sales person to control position/viewpoint of each of the users within the VR walkthrough according to position/viewpoint of the sales person (i.e. guided mode). Further, the collaborative sales tool may present the current location of each user in relation to the 3D walkthrough to the salesperson. Further, the collaborative sales tool may provide individual screen viewing capabilities for both the operator and the user, where both have unique viewing experience, along with a lock feature to guide the user when required. Further, the collaborative sales tool may provide a Web, mobile, and VR collaboration platform for a remote virtual site visit of the real estate. Further, the collaborative sales tool may enable a remote Telepresence in the real estate using a robotic avatar and showcase through the web, mobile, or VR platform.

Further, the present disclosure describes an interior recommendation engine based on a profile. The engine includes an automatic mood-board generator. Further, the engine includes an ML based vendor recommendation engine. The interior recommendation engine automatically selects interior furnishings based on the profile of a user viewing the 3D VR walkthrough. Further, the interior recommendation engine automatically determines a user context (e.g. geographical location, user preferences, etc.) and populates the 3D VR with objects (e.g. furniture) based on the user context. Further, the interior recommendation engine may automatically select interior furnishing based on profile a user viewing the 3D VR walkthrough. Further, the interior recommendation engine may automatically determine a user context (e.g. geographical location, user preferences etc.) and populating the 3D VR with objects (e.g. furniture) based on the user context. Further, the interior recommendation engine may understand a user's design preference from a set of images and then putting that style into context for an interior recommendation. Further, the interior recommendation engine may perform interior furnishing based on pupil detection of what the user likes from a set of images flashing on a screen. Further, the interior recommendation engine may be based on cookies data that gather information on how the user has liked or saved certain images. Further, the interior recommendation engine may provide the interior recommendation based on a social profile of the user and his/her activities.

Further, the present disclosure describes a method for providing real estate search maps (GIS).

Further, the present disclosure describes an automatic mood-board generator. The automatic mood-board generator may select multiple images, colors, textures, and styles to create a mood board automatically. Further, the automatic mood-board generator may understand a user's preference based on a set of likeable images and creates a mood board automatically. Further, the automatic mood-board generator may instantly generate a mood board based on the user's preference, a social profile, and interior styles.

Further, the present disclosure describes an ML based lead scoring algorithm. Further, the present disclosure describes an ML based listing scoring algorithm. Further, the present disclosure describes an ML based recommendation algorithm. Further, the present disclosure describes an ML based sales closure algorithm. Further, the present disclosure describes an AI-ML based image enhancement algorithm. Further, the present disclosure describes an ML based agent recommendation algorithm. Further, the present disclosure describes an AI-ML based customer decision matching with an ideal listing algorithm.

Further, the present disclosure describes a method for converting low plans or model flat into an interactive 3d experience. In case of a floor plan, the method includes employing AI-based 3D engine to convert the floor plan into a photorealistic 3D walkthrough experience that allows the real estate industry to save costs. This may be game changer for the real estate because now they can visualize all of their variants into a realistic walkthrough experience where the customers can understand the space much better. In case of a physical model flat, a set of 360 images are captured and uploaded to a cloud-based platform. Once this is done, the method converts the 360 images into an interactive walkthrough experience. These digital experiences can be created in hours instead of weeks and it supports all kinds of devices. The experience also enables improvements in customer engagement by up to 400 percent and since the platform is automated it cuts down the cost by up to 80%.

The disclosed browser-based application allows sales teams to share links to their customers and provides an open house kind of concept which mimics the real virtual site visit. The application enables sales persons to track pixel level details for every customer and gives a dashboard for analytics. The disclosed collaboration and analytics platform enables vertical integration for visualization for the real estate industry.

According to some embodiments, a method of provisioning a virtual experience is disclosed. The method may include receiving, using a communication device, a 2D floor plan data associated with a building. Further, the method may include receiving, using the communication device, at least one contextual data associated with the 2D floor plan data. Further, the method may include analyzing, using a processing device, each of the 2D floor plan data and the at least one contextual data using a machine learning model. Further, the method may include determining, using a processing device, at least one textual data embedded in the 2D floor plan data based on the analyzing. Further, the method may include identifying, using the processing device, a plurality of building objects based on the analyzing. Further, the method may include identifying, using the processing device, a plurality of amenity regions associated with the plurality of building objects based on the analyzing and the at least one textual data. Further, the method may include identifying, using the processing device, a plurality of utility objects disposable in the plurality of amenity regions based on the identifying of the plurality of amenity regions. Further, the method may include retrieving, using a storage device, a plurality of virtual building objects corresponding to the plurality of building objects. Further, the method may include retrieving, using a storage device, a plurality of virtual utility objects corresponding to the plurality of utility objects. Further, the method may include generating, using the processing device, an interactive 3D model data associated with the 2D floor plan data based on the analyzing, the plurality of virtual building objects and the plurality of virtual utility objects, wherein the interactive 3D model data comprises the plurality of virtual building objects and the plurality of virtual utility objects. Further, the method may include transmitting, the interactive 3D model data to a user device configured to present the interactive 3D model data. In further embodiments, the generating may include creating illumination data associated with the interactive 3D model data based on the at least one contextual data.

According to some embodiments, a method of provisioning a virtual experience of a building on a user device is disclosed. The method may include transmitting, using a communication device, a first portion of an interactive 3D model data associated with a virtual 3D building to the user device. Further, the user device may be configured for presenting, using a presentation device, a first image based on the portion of the interactive 3D model data. Further, the user device may be configured for receiving, using an input device, a user action data from the user device. Further, the user action data is based on an interaction of a user with the interactive 3D model data. Further, the user device may be configured for presenting, using the presentation device, a second image based on the portion of the interactive 3D model data and the user action data. Further, the method may include receiving, using the communication device, the user action data. Further, the method may include analyzing, using a processing device, the user action data and the first portion of the interactive 3D model data. Further, the method may include identifying, using a processing device, a second portion of the interactive 3D model data based on the analyzing. Further, the method may include transmitting, using the communication device, the second portion of the interactive 3D model data to the user device.

In further embodiments, the method may include transmitting, using the communication device, at least one real estate property identifier to a governmental database. Further, the method may include receiving, using the communication device, at least one governmental record associated with the at least one real estate property identifier from the governmental database. Further, the method may include generating, using the processing device, the interactive 3D model data based on the governmental record. Further, the at least one governmental record may include an indication of sale status of a real estate property associated with the interactive 3D model data.

In further embodiments, the method may include receiving, using the communication device, a reaction data from the user device, wherein the user device comprises at least one sensor configured to generate the reaction data based on a behavioral reaction of a user during an interaction with the interactive 3D model data, wherein the generating comprises updating the interactive 3D model data based on the reaction data.

According to some embodiments, a method of provisioning a virtual experience of a building based on user preference is disclosed. The method may include receiving, using a processing device, an identity data associated with an identity of a user. Further, the method may include retrieving, using a storage device, a user profile data based on the identity data. Further, the method may include analyzing, using the processing device, the user profile data using a machine learning model. Further, the method may include determining, using the processing device, at least one preference data based on the analyzing. Further, the method may include identifying, using the processing device, at least one virtual utility object based on the at least one preference data. Further, the method may include generating, using the processing device, an interactive 3D model data comprising the at least one virtual utility object. Further, the method may include transmitting, using a communication device, the interactive 3D model data to a user device configured to present the interactive 3D model data. Further, the method may include receiving, using the communication device, a reaction data from the user device. Further, the user device may include at least one sensor configured to generate the reaction data based on a behavioral reaction of a user consuming the interactive 3D model data. Further, the generating may include updating the interactive 3D model data based on the reaction data.

Further, the user device comprises a wearable display device comprising an iris detector configured to capture an image of an iris of the user. Further, the receiving may include receiving, using the communication device, the image of the iris, analyzing, using the processing device, the image of the iris and determining, using the processing device, the identity data based on the analyzing of the image of the iris.

Now referring to figures, FIG. 1 is a user interface 100 showing a floor plan view (2D), in accordance with some embodiments. The user interface 100 allows users to easily switch from the floor plan view to a bird eye view (shown in FIG. 2) or a 360 view. The process starts with a 2D floor plan. The user interface is created using a set of 360 images. The disclosed methods and systems obtain the 360 images and automatically create the user experience in a few hours. The user interface can be hosted on any kind of browser.

Figure 2:
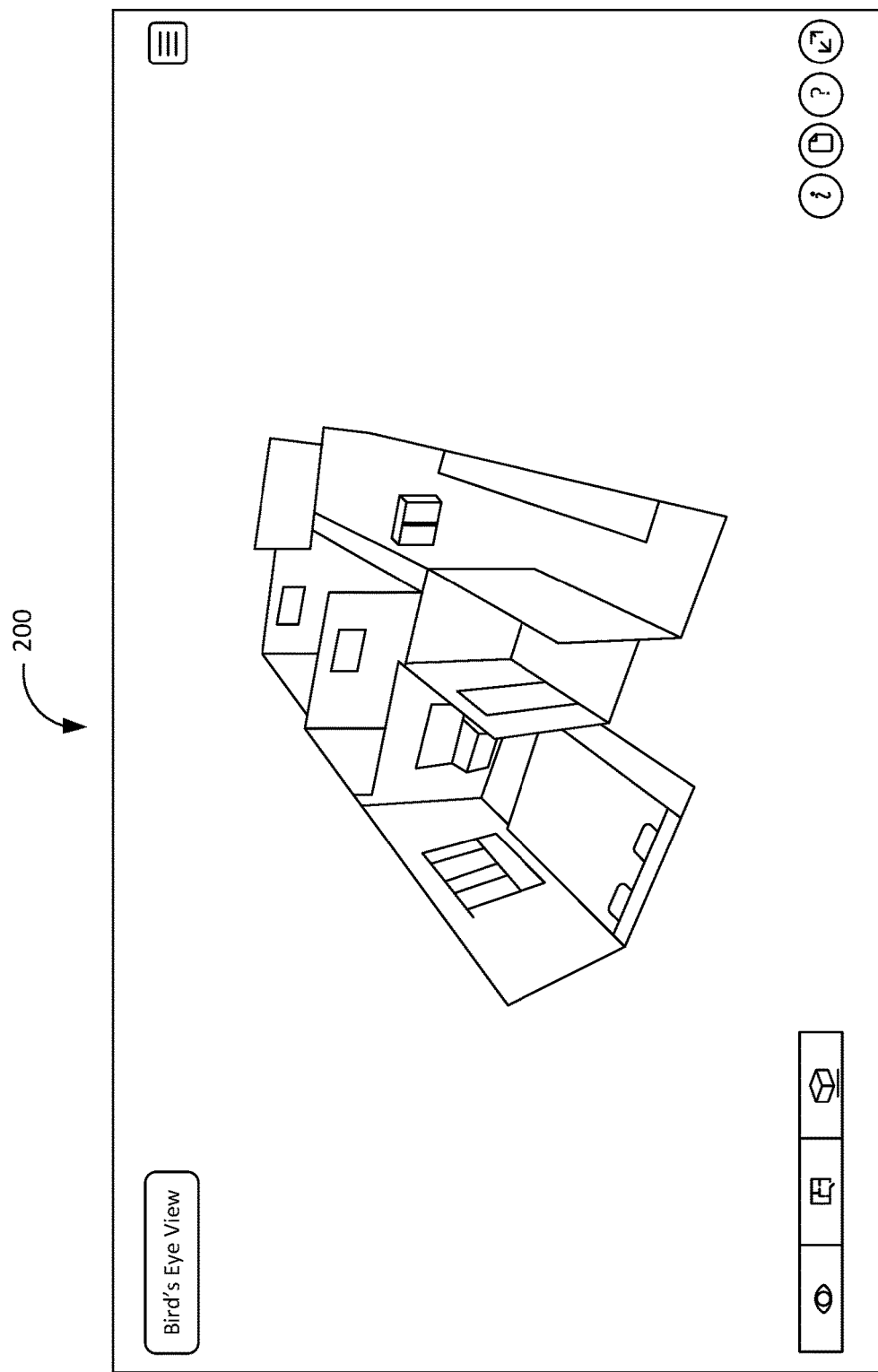
FIG. 2 is a user interface showing a bird eye view (3D), in accordance with some embodiments.

FIG. 2 is a user interface 200 showing a bird eye view (3D), in accordance with some embodiments. Once a user switches from the floor plan view to the bird eye view, the entire experience is interactive and intuitive. The users can zoom in or zoom out the bird eye view. They can click anywhere on the bird eye view to enter that particular spot (shown in FIG. 3).

Figure 3:
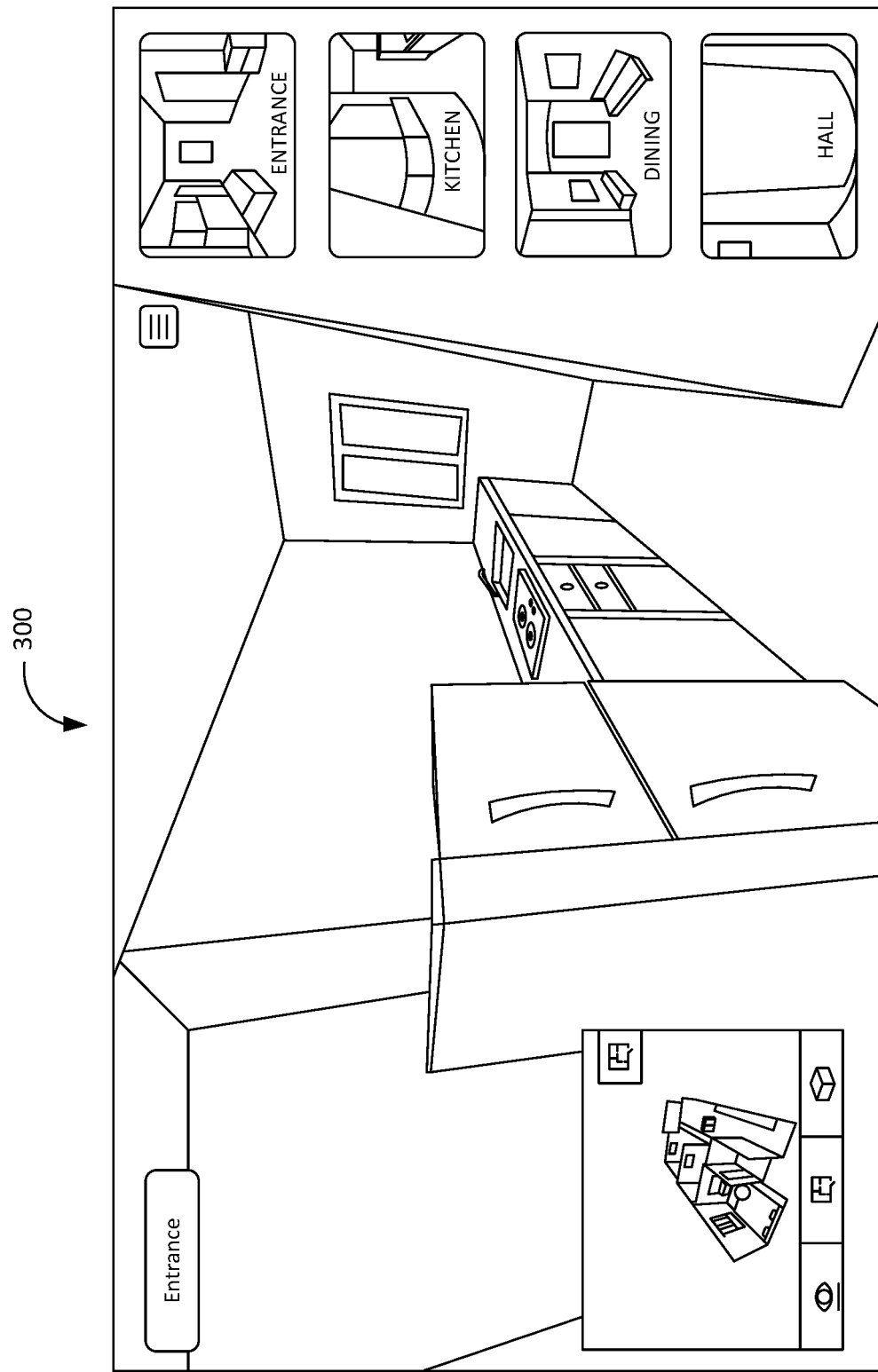
FIG. 3 is a user interface showing an interior view, in accordance with some embodiments.

FIG. 3 is a user interface 300 showing an interior view (kitchen), in accordance with some embodiments. Here, the users can easily interact with the 360 images and also click anywhere on the 360 images to actually go in that particular direction. The user interface 300 may also include a quick navigation bar on the right side where the customers can quickly jump to any particular room that they wanted to go to. The user experience is designed to help the user feel they are actually at the location walking through the facility.

Further, the disclosed methods and systems may allow users to add an information layer about the project which shows the entire square feet area project information, project address, and have a call to action button. This information may be displayed in an overlay box on the user interface 300.

Further, the disclosed methods and systems may allow users to showcase nearby locations. So users can select from banks, hospitals, or know more about the locations of the project.

Further, the disclosed methods and systems may allow users to include the brochure of the particular project. They may add any number of brochures. The brochure could be an extremely useful tool where the customers can look through the entire project details.

According to some embodiments, a collaborative sales tool may enable a sales person to provide guided VR tours (using video/voice/chat) to multiple users where each user has control of position/viewpoint within the VR walkthrough.

A sales person may log in to the collaborative sales tool to view all the projects that have been uploaded to the tool. Thereafter, the sales person can create a session by selecting a project for which they want to create a session. Similar to how video conference calls are started, the sales person may just create a session and the collaborative sales tool will prompt to share the link to the customers who want to join in the session.

Figure 4:
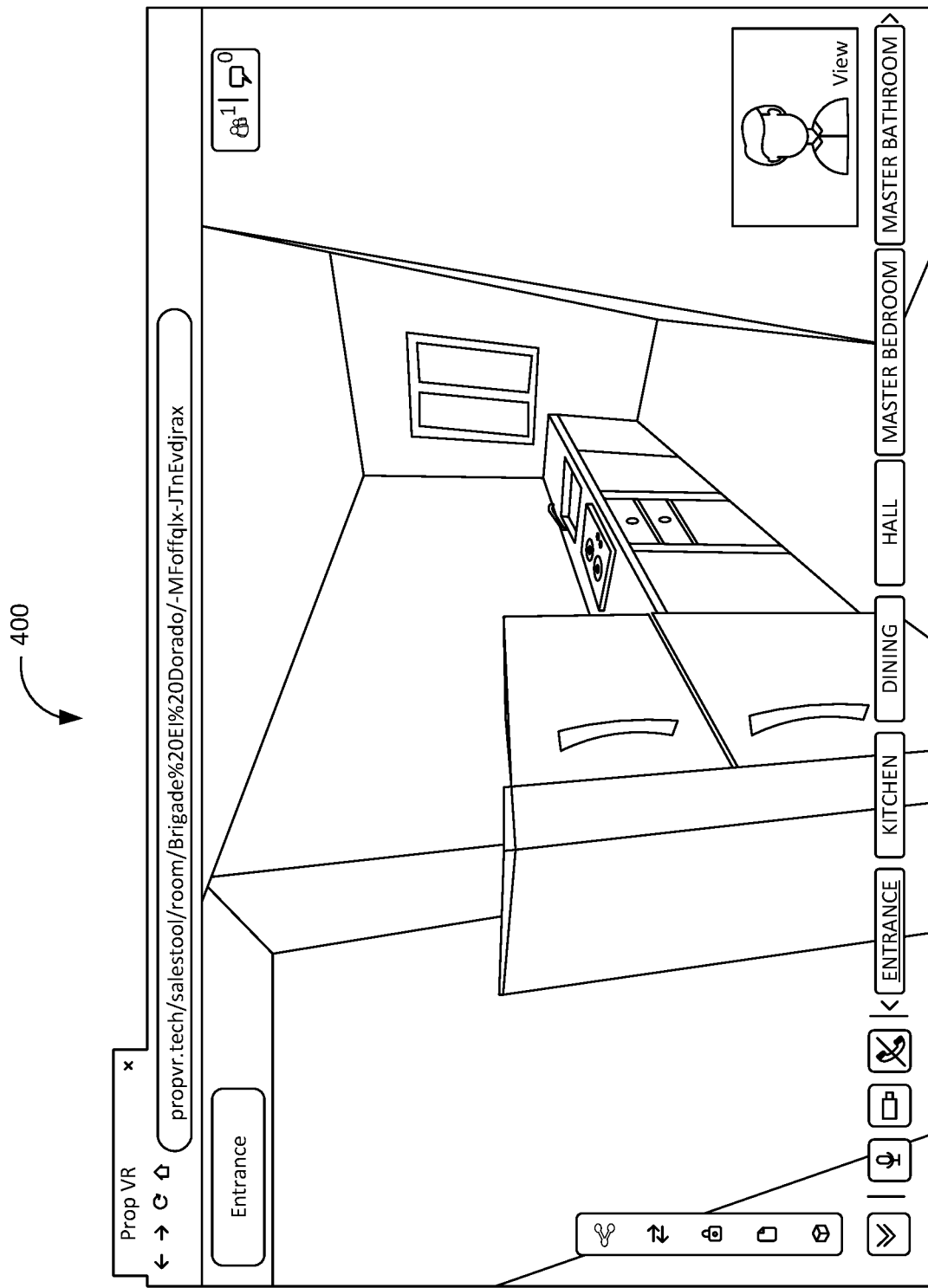
FIG. 4 is a user interface associated with the collaborative sales tool, in accordance with some embodiments.

FIG. 4 is a user interface 400 associated with the collaborative sales tool, in accordance with some embodiments. The user interface 400 may include a central virtual tour screen and a video chat that is embedded inside. Further, the voice may be recorded as well.

Further, the user interface 400 may include a list of tools on the left side which allows to collaborate effectively. Further, there may be options to mute call and end call. Further, they may be a set of super links (near the bottom of the user interface 400) that allows the sales person to quickly navigate between one virtual tour through the other virtual tour.

The sales person may invite customers to the session by sharing an invite link. Once the customer clicks on the invite link, the collaborative sales tool may ask him to enter basic details, such as name, email id, and phone number. Next, it may ask him to give permission for a microphone and a camera. The customer may choose to switch off this video while entering the session. Once the customer joins, they can use the user interface to look around just like they would do in a site visit. Further, the customer is free to navigate.

Figure 5:
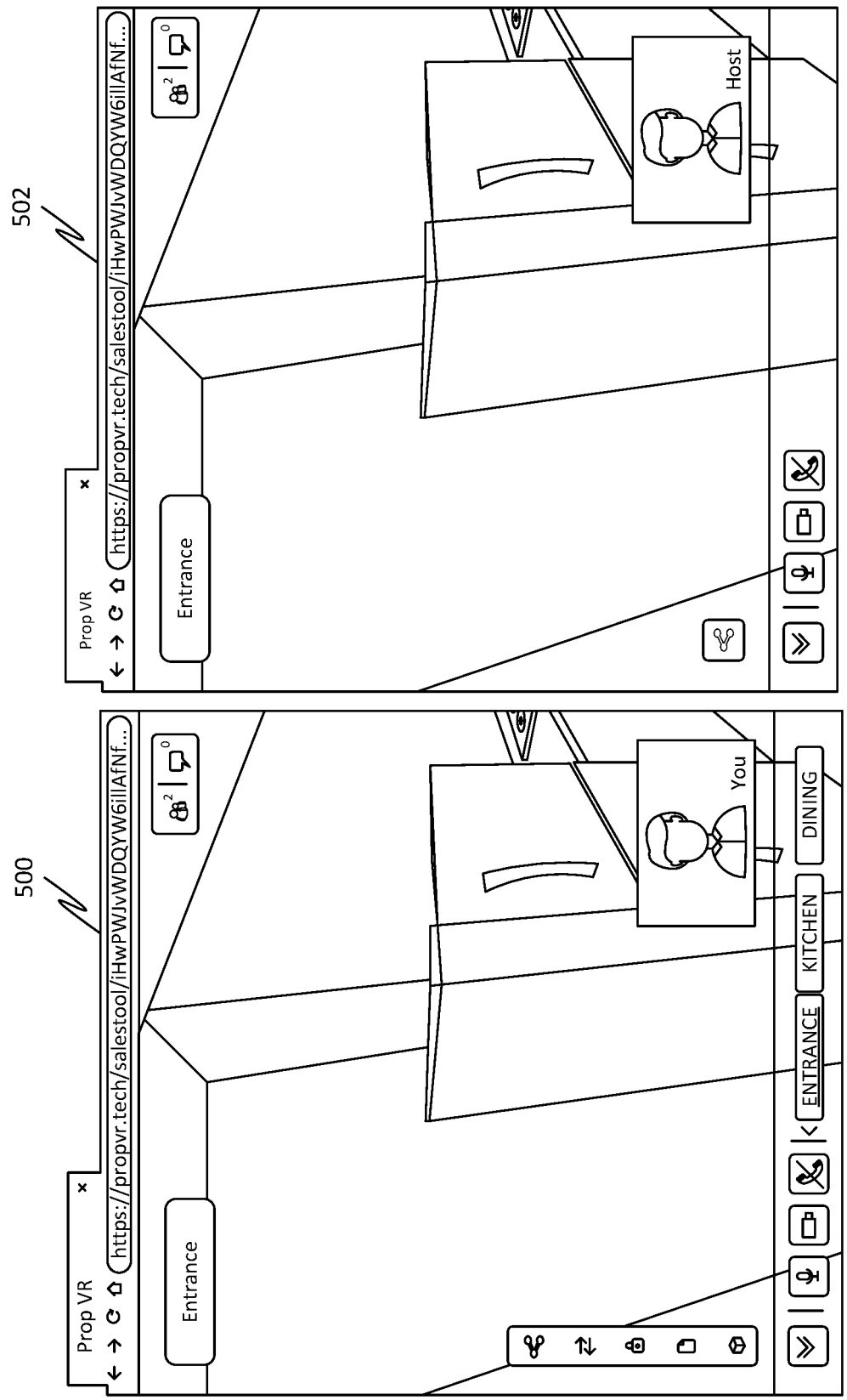
FIG. 5 is a user interface associated with the collaborative sales tool, in accordance with some embodiments.

FIG. 5 is a user interface 500-502 associated with the collaborative sales tool, in accordance with some embodiments. The user interface 500 is what the sales person will be looking at and the user interface 502 is what the customer will be looking at. Then, the sales person can navigate wherever he wants to take the customer. For example, if the sales person wants to take the customer to the dining room, then he can click at an appropriate location and the tool would navigate both of them to the dining room. This mimics the same kind of experience the customer and sales person would do in a real site visit.

Further, the customer and the salesperson are connected via voice and video chat, so they can discuss different project details and requirements. Further, the sales person may have to showcase something specific to the customer and explain to him about that particular feature. The sales person will have to just have to look at that particular feature and click on the guided mode option available on the user interface 500. The user interface 502 would automatically update such that the customer would follow wherever the sales person would be looking at. To switch off the guided mode, the sales person may click on an unlock option available on the user interface 500. This allows the customer to go back into a self-engagement manner. Further, the sales person can open up brochures. While the customer is online, the salesperson can open up the project brochure and take him through the step-by-step storyboard of the project. The brochure may also include flow plans other documents that you would need to explain to the customer in detail. The brochures showed on the user interface 500 and the user interface 502 are connected. So if the salesperson wants to explain in a storyboard format, he can just click on the next page and it'll open the next page for the customer.

Figure 6:
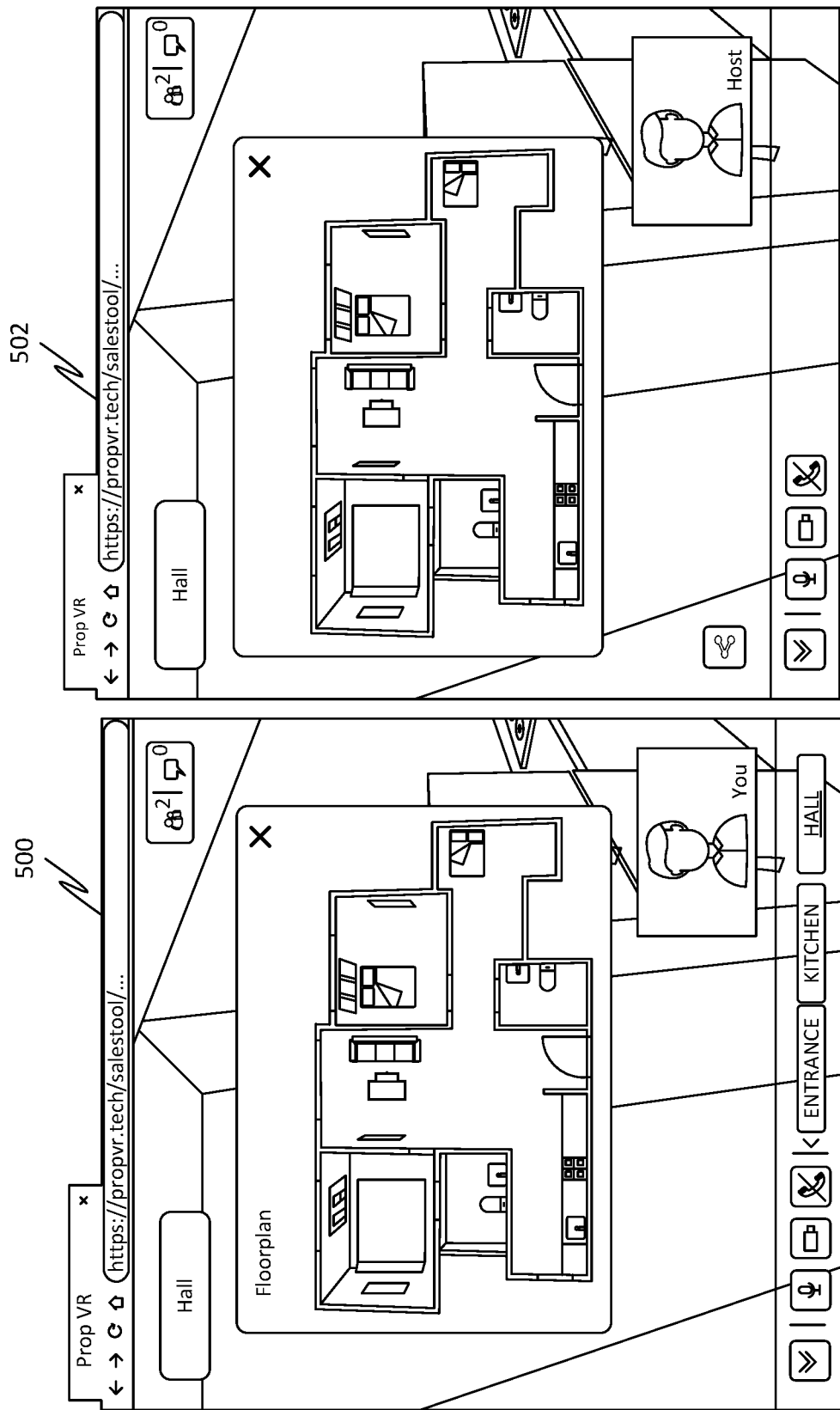
FIG. 6 is a user interface associated with the collaborative sales tool, in accordance with some embodiments.

Another feature on the user interfaces 500-520 is the floor plan feature (shown in FIG. 6) that allows to quickly jump to specific rooms or to explain the floor plan layout to the customer. So if the customer wanted to go to one of the bedrooms, the sales person just has to click that particular bedroom and it'll take the customer to that room.

Further, the salesperson also has the option to switch projects. So they could switch from one project to another without ending the session. Further, the collaborative sales tool also allows the sales person to collect feedback from the customer, such as when to approach him for the next call. The collaborative sales tool will help to collaborate efficiently and convert clients faster.

The sales person may host a session using any device such as a VR headset, touchscreen walls, smart devices (such as Android™ or iOS™ based devices. Further, the customers may join the session using any device. The collaborative sales tool may allow the sales person to start the session in phone mode or VR mode.

Figure 7:
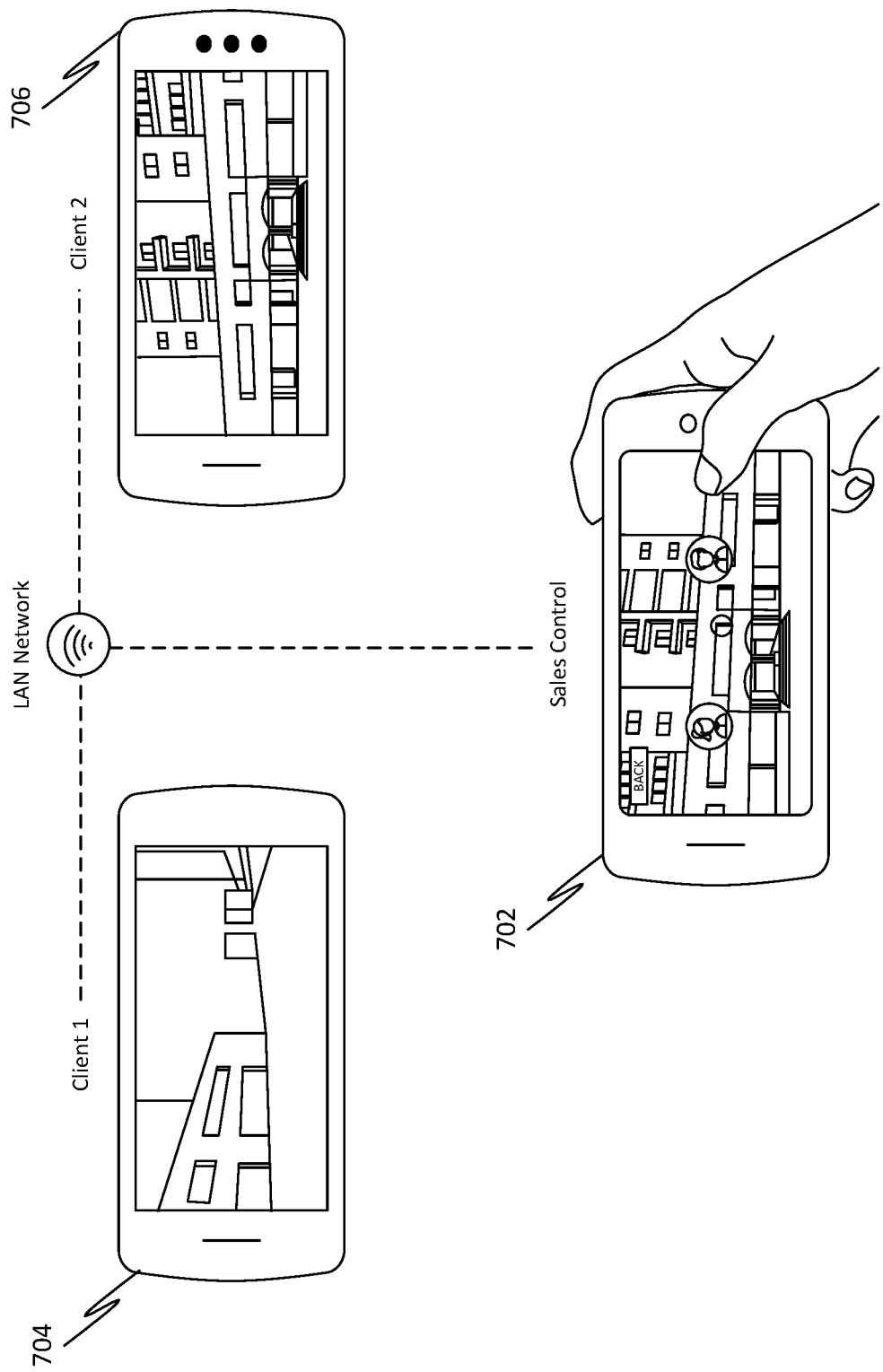
FIG. 7 is a schematic showing communication between a smart device of a sales person and smart devices of one or more customers, in accordance with some embodiments.

FIG. 7 is a schematic showing communication between a smart device 702 of a sales person and smart devices 704-706 of one or more customers, in accordance with some embodiments. The sales person may control a guided tour using the smart device 702. The guided tour may include a tour of an exterior or interior of a building. With the collaborative sales tool, 30 devices may be connected on a single session. The collaborative sales tool helps sales person showcase projects anywhere without any hassles. The collaborative sales tool saves time and money in converting leads. The collaborative sales tool may be used in exhibitions, sales launches, international showcases, and marketing activities. The collaborative sales tool may improve the efficiency of sales teams.

According to some embodiments, a showcase tool allows users to deploy high-end 3d visualizations on a browser and also allows users to collaborate with voice and video chat. Once a session is created, similar to other collaborative platforms, it will ask the sales person to copy a joining link.

Figure 8:
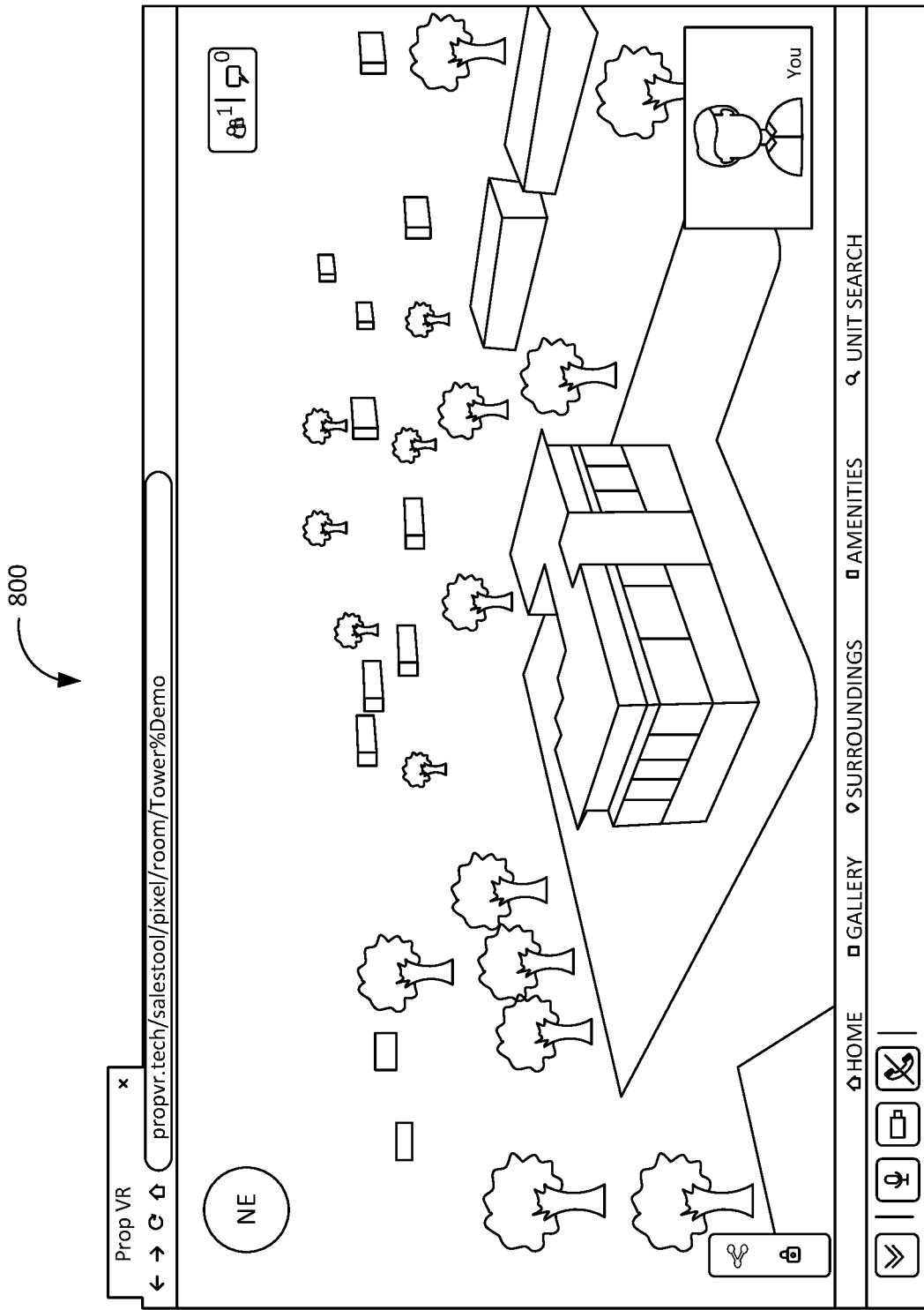
FIG. 8 is a user interface associated with the showcase tool, in accordance with some embodiments.

FIG. 8 is a user interface 800 associated with the showcase tool, in accordance with some embodiments. A high-end 3d application is running in the center of the user interface 800. The showcase tool may run on a browser, so users would not need any heavy system or high-end graphics cards to run. The showcase tool may be deployed on mobile phone tablets or even VR headsets. Once the showcase tool is deployed, it has an overlay that allows sales persons to share or give access to the clients. They may also access a video functionality provided on the right bottom of the user interface 800. Further, the salesperson can look at the number of members and also chat with the members.

The showcase tool may include an option to view a surroundings view to provide a complete picture of the entire surroundings along with the nearby amenities. Further, the showcase tool may include an inventory management tool that may allow the sales person to click on the projects and do a live booking, live reservation of that particular unit while on a call with a customer.

Figure 9:
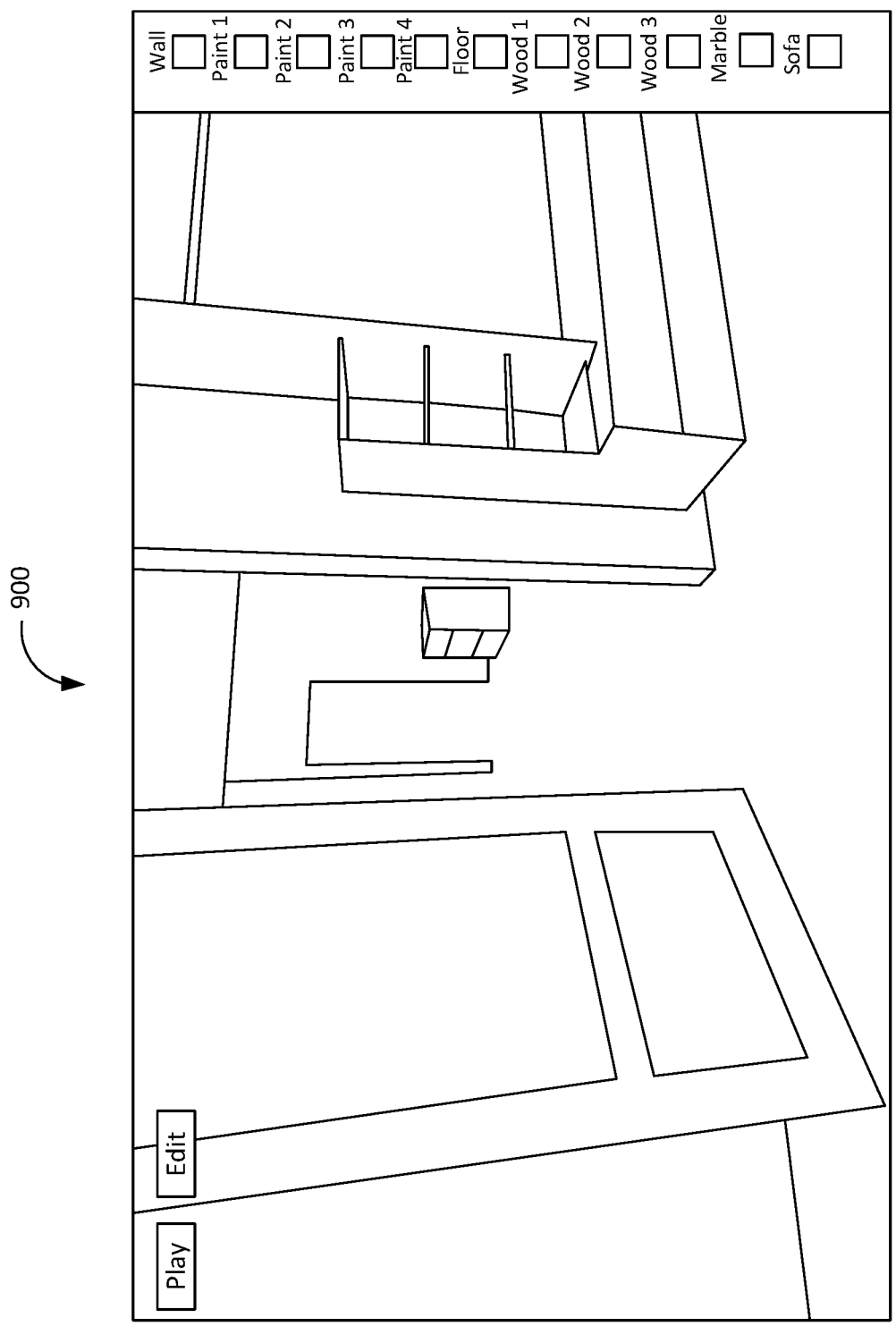
FIG. 9 is a user interface showing options to customize interiors, in accordance with some embodiments.

FIG. 9 is a user interface 900 showing options to customize interiors, in accordance with some embodiments. The user interface 900 shows a menu on the right that provides various options for the flooring. A user may select any options and the user interface 900 shows the selected flooring in the view. Similarly, the users may customize paint colors on the walls.

Figure 10:
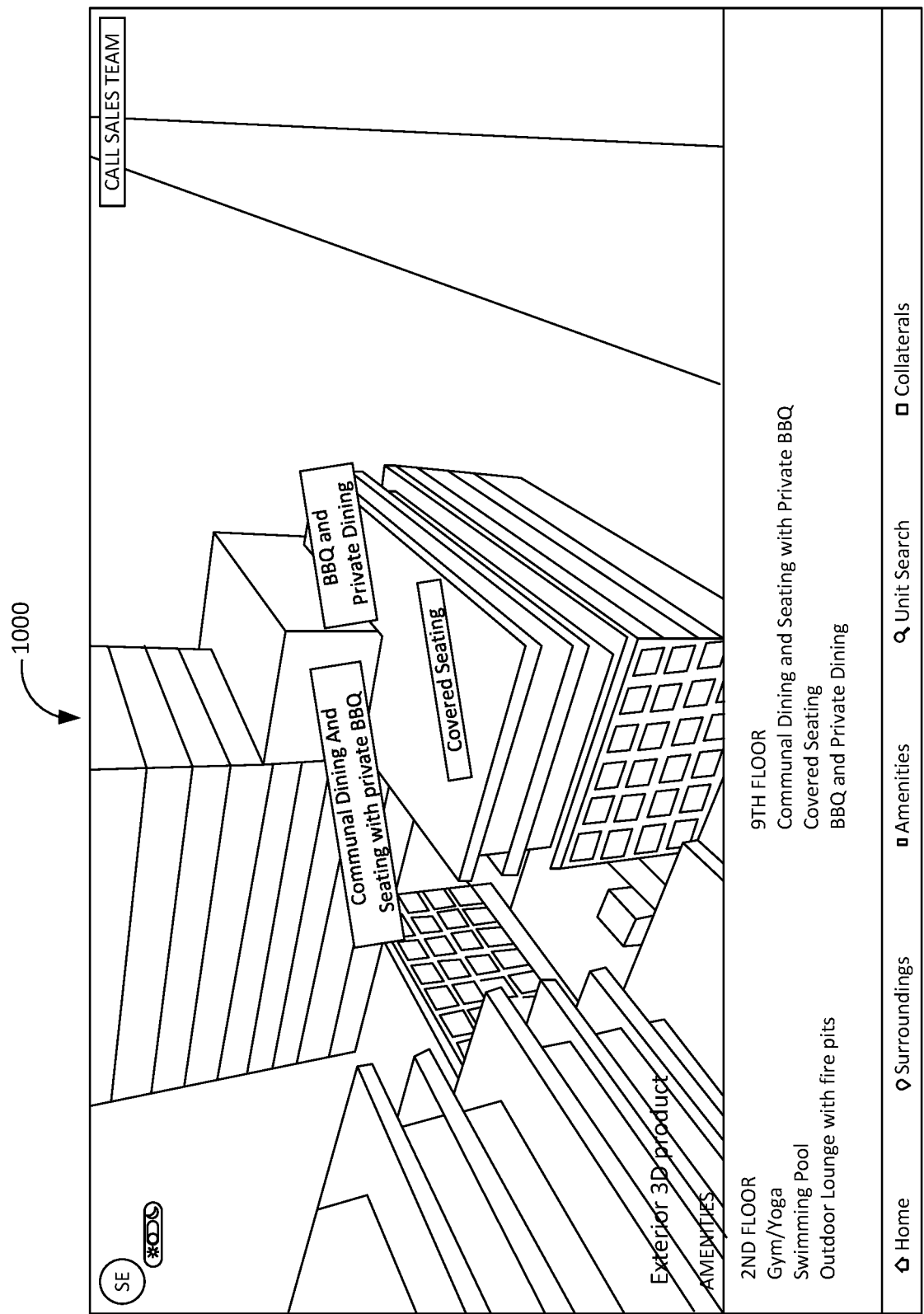
FIG. 10 is a user interface showing an exterior view of a building, in accordance with some embodiments.

FIG. 10 is a user interface 1000 showing an exterior view of a building, in accordance with some embodiments. The user interface 1000 may use text overlays to show amenities such as "Communal Dining And Seating with private BBQ." The user interface 1000 may allow users to switch between night and day modes.

Figure 11:
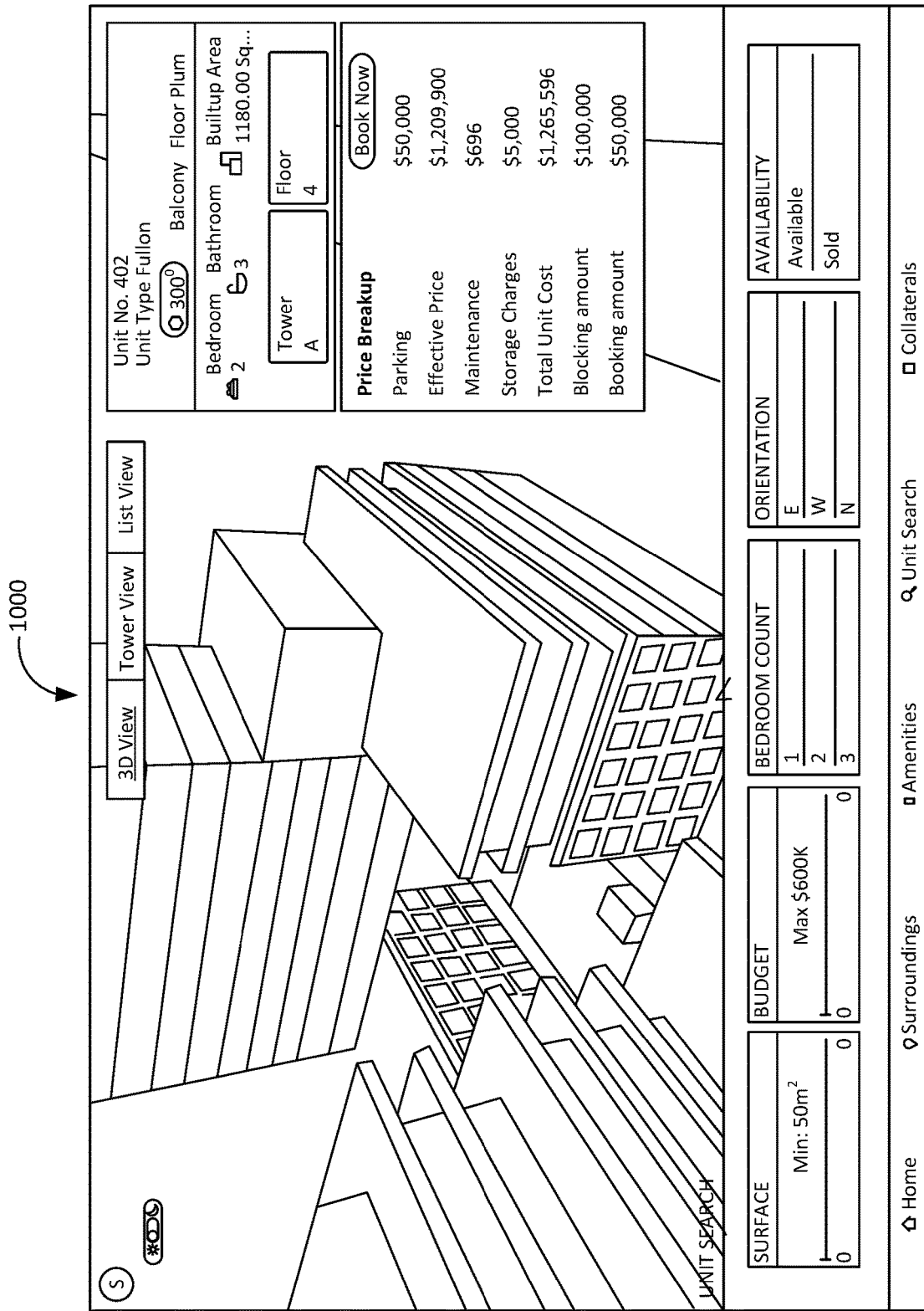
FIG. 11 is the user interface showing the exterior view of a building, in accordance with some embodiments.

FIG. 11 is the user interface 1000 showing the exterior view of a building, in accordance with some embodiments. As shown on the top right, the user interface 1000 may display the inventor information, price breakup, etc.

According to some embodiments, a browser based creation tool is used by a user to log into the creation tool to create new projects or edit old projects. Thereafter, the creation tool may allow the users to add scenes or 360 images to a project. The creation tool creates a 3D walkthrough view automatically. It may allow users to add hotspots for navigation. Further, the creation tool may allow the users to add floor plans and add markers on the floor plans.

Figure 12:
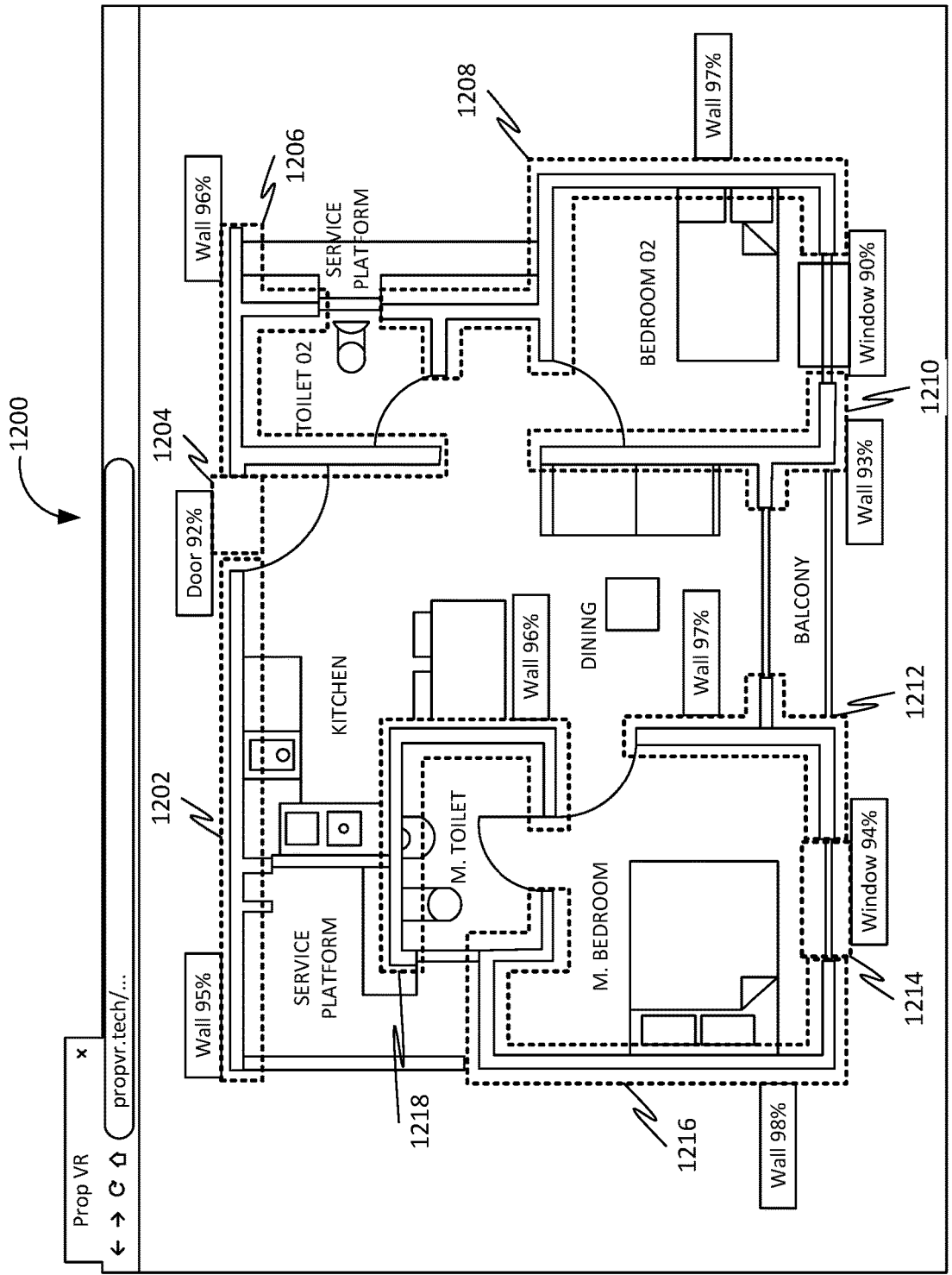
FIG. 12 is a floor plan view showing detected one or more features, in accordance with some embodiments.

FIG. 12 is a floor plan view 1200 showing detected one or more features 1202-1218, in accordance with some embodiments. The disclosed methods and systems may employ AI and ML algorithms, including OCR, to detect walls, floors, doors, and furniture from a floor plan image. The dotted lines in the floor plan view 1200 show the detected one or more features 1202-1218 along with the confidence values for each detected feature.

Figure 13:
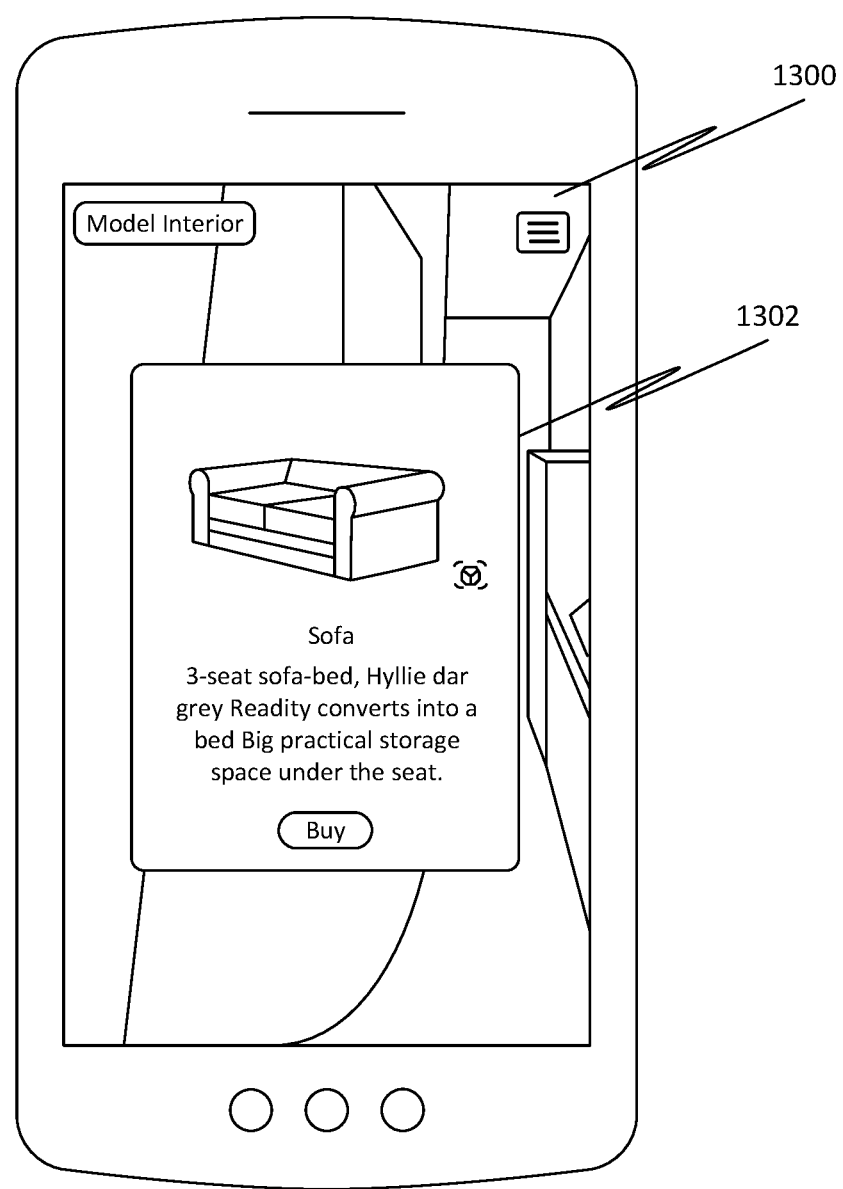
FIG. 13 is a user interface showing a sofa selected by a user, in accordance with some embodiments.
Figure 14:
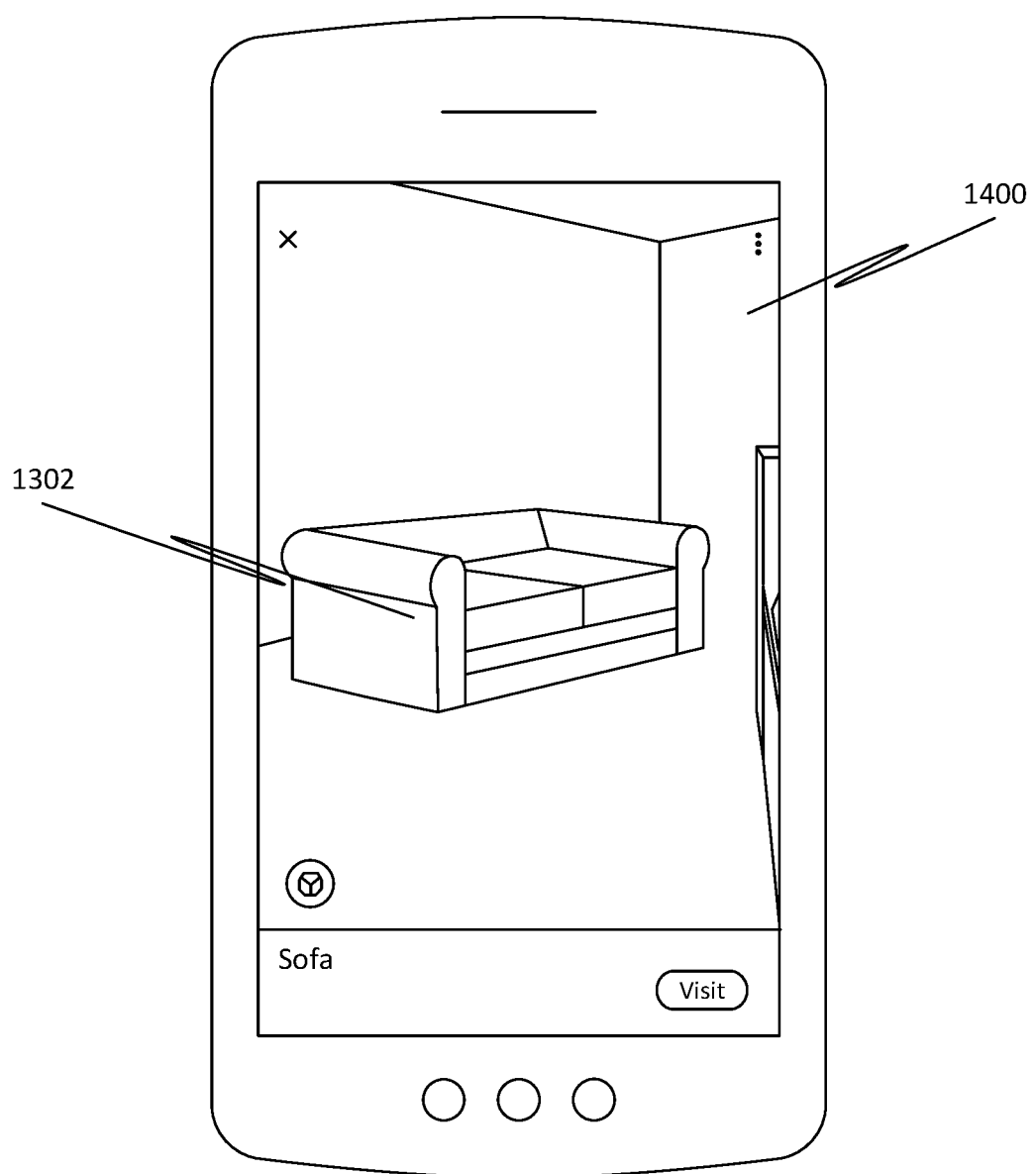
FIG. 14 is a user interface showing the sofa in the user space, in accordance with some embodiments.

FIG. 13 is a user interface 1300 showing a sofa 1302 selected by a user, in accordance with some embodiments. The disclosed systems and methods allow users to visualize furniture items in their own spaces (such rooms etc.) FIG. 14 is a user interface 1400 showing the sofa 1302 in the user space, in accordance with some embodiments.

Figure 15:
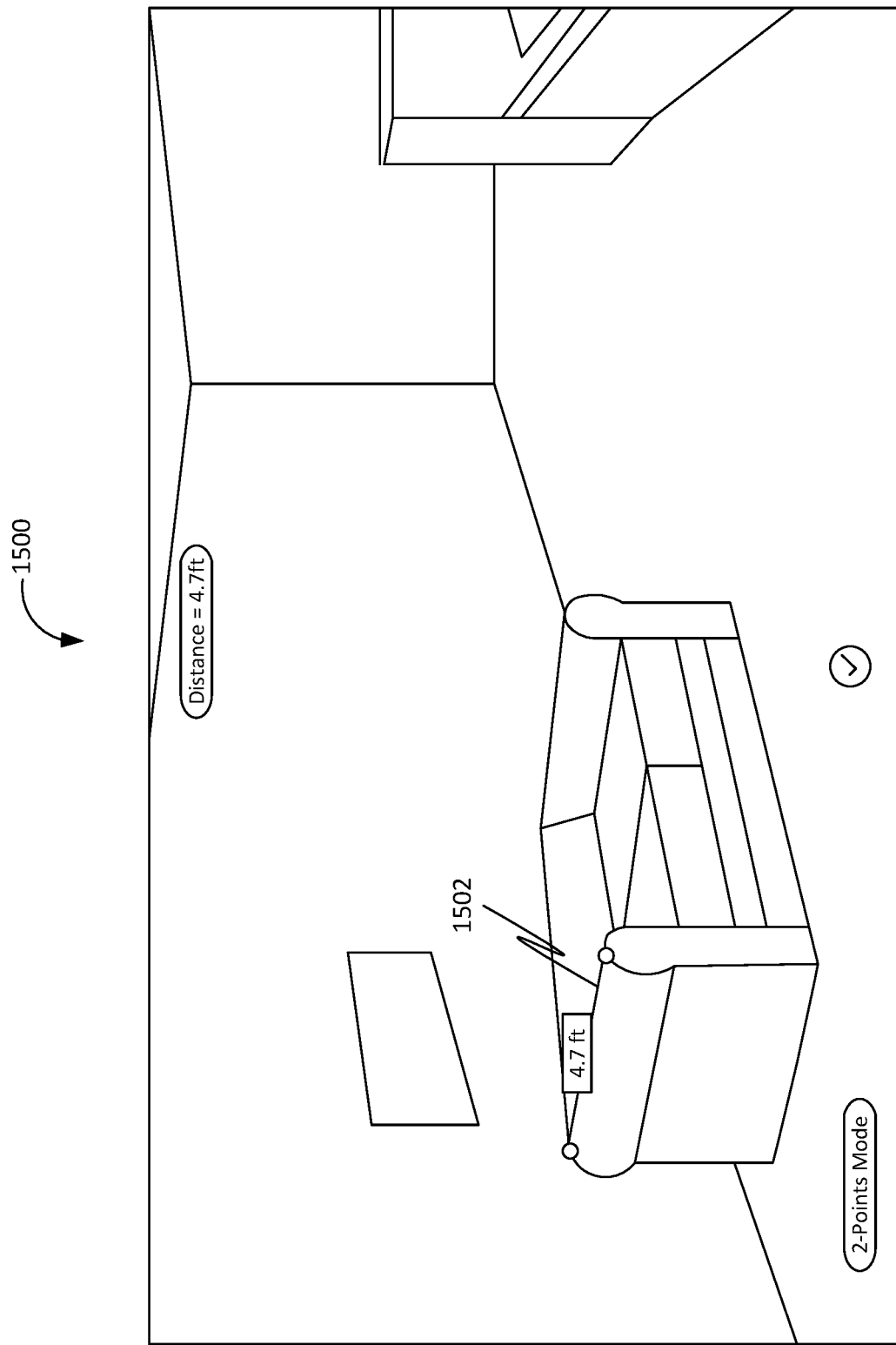
FIG. 15 is a user interface that allows a user to perform measurements in a measurement mode, in accordance with some embodiments.

FIG. 15 is a user interface 1500 that allows a user to perform measurements in a measurement mode in accordance with some embodiments. The disclosed methods and systems may provide the measurement mode. The user may select an edge 1502 in the user interface in the measurement mode. Further, the disclosed methods and systems may analyze the selected edge, determine the length of the selected edge, and display the length on the user interface 1500.

Figure 16:
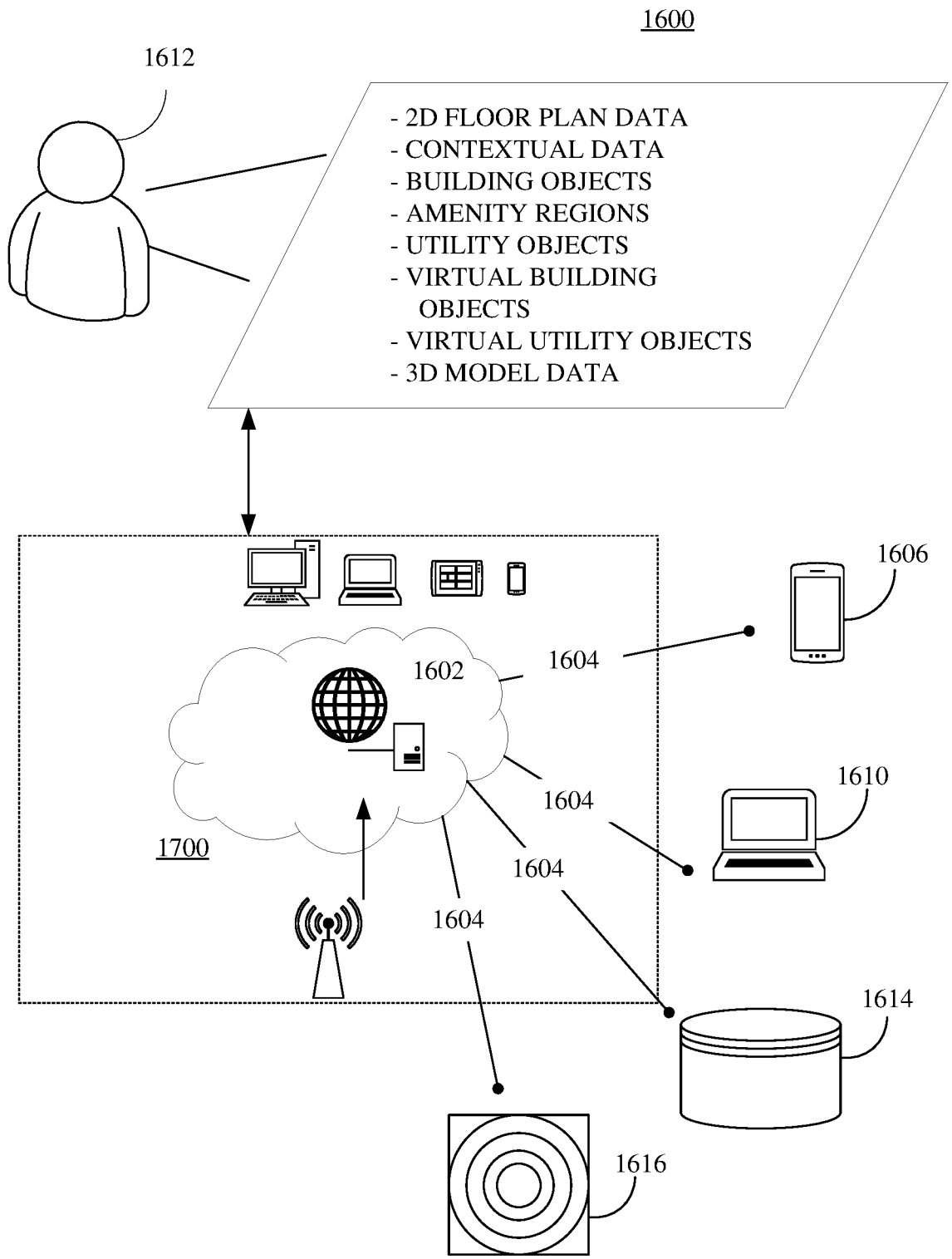
FIG. 16 is an illustration of an online platform consistent with various embodiments of the present disclosure.

FIG. 16 is an illustration of an online platform 1600 consistent with various embodiments of the present disclosure. By way of non-limiting example, the online platform 1600 to facilitate provisioning a virtual experience of a building based on user profile data may be hosted on a centralized server 1602, such as, for example, a cloud computing service. The centralized server 1602 may communicate with other network entities, such as, for example, a mobile device 1606 (such as a smartphone, a laptop, a tablet computer etc.), other electronic devices 1610 (such as desktop computers, server computers etc.), databases 1614, and sensors 1616 over a communication network 1604, such as, but not limited to, the Internet. Further, users of the online platform 1600 may include relevant parties such as, but not limited to, end-users, administrators, service providers, service consumers and so on. Accordingly, in some instances, electronic devices operated by the one or more relevant parties may be in communication with the platform.

A user 1612, such as the one or more relevant parties, may access online platform 1600 through a web based software application or browser. The web based software application may be embodied as, for example, but not be limited to, a website, a web application, a desktop application, and a mobile application compatible with a computing device 1700.

Figure 17:
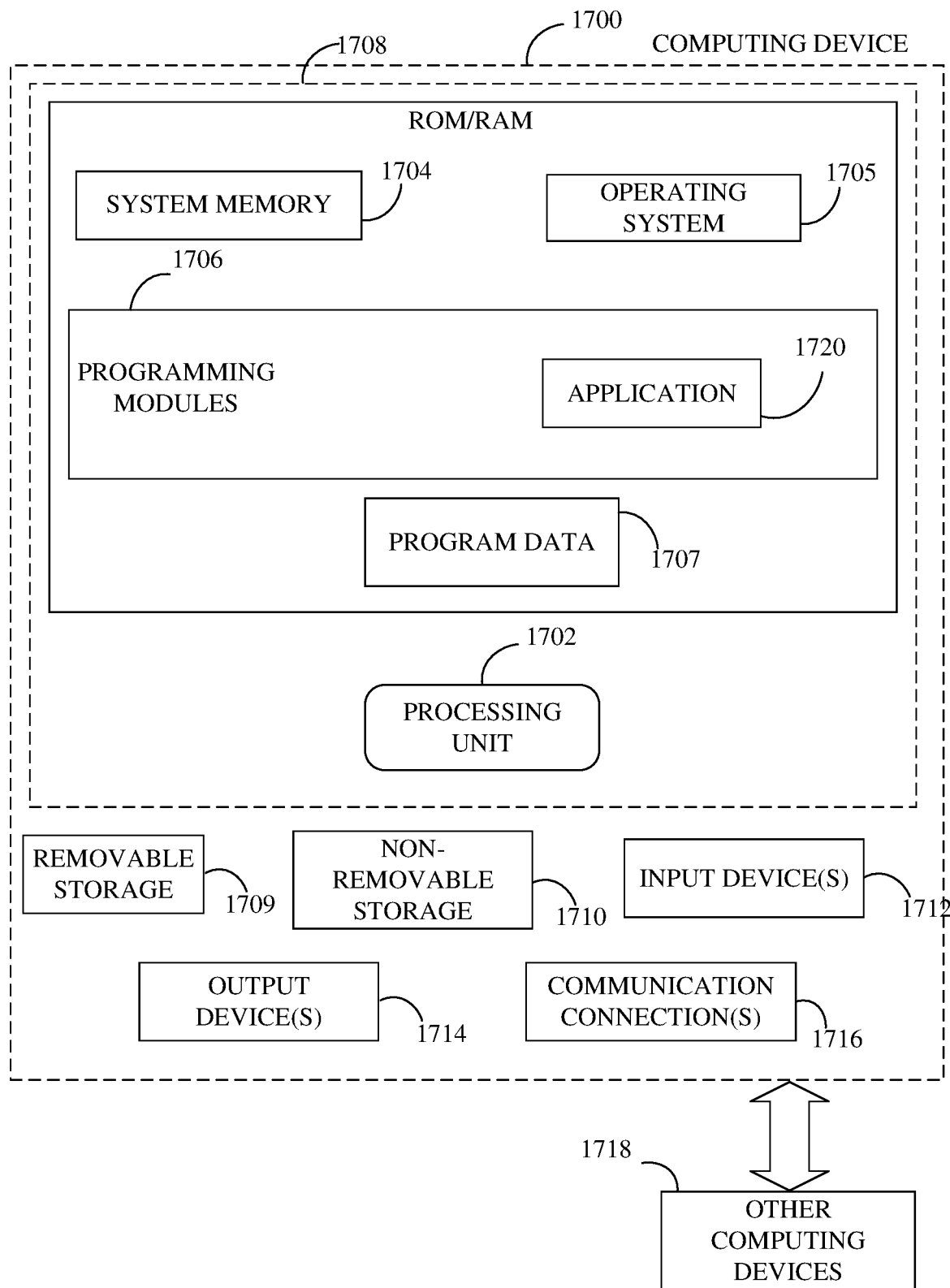
FIG. 17 is a block diagram of a computing device for implementing the methods disclosed herein, in accordance with some embodiments.

With reference to FIG. 17, a system consistent with an embodiment of the disclosure may include a computing device or cloud service, such as computing device 1700. In a basic configuration, computing device 1700 may include at least one processing unit 1702 and a system memory 1704. Depending on the configuration and type of computing device, system memory 1704 may comprise, but is not limited to, volatile (e.g. random-access memory (RAM)), non-volatile (e.g. read-only memory (ROM)), flash memory, or any combination. System memory 1704 may include operating system 1705, one or more programming modules 1706, and may include a program data 1707. Operating system 1705, for example, may be suitable for controlling computing device 1700's operation. In one embodiment, programming modules 1706 may include image-processing module, machine learning module. Furthermore, embodiments of the disclosure may be practiced in conjunction with a graphics library, other operating systems, or any other application program and is not limited to any particular application or system. This basic configuration is illustrated in FIG. 17 by those components within a dashed line 1708.

Computing device 1700 may have additional features or functionality. For example, computing device 1700 may also include additional data storage devices (removable and/or non-removable) such as, for example, magnetic disks, optical disks, or tape. Such additional storage is illustrated in FIG. 17 by a removable storage 1709 and a non-removable storage 1710. Computer storage media may include volatile and non-volatile, removable and non-removable media implemented in any method or technology for storage of information, such as computer-readable instructions, data structures, program modules, or other data. System memory 1704, removable storage 1709, and non-removable storage 1710 are all computer storage media examples (i.e., memory storage.) Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by computing device 1700. Any such computer storage media may be part of device 1700. Computing device 1700 may also have input device(s) 1712 such as a keyboard, a mouse, a pen, a sound input device, a touch input device, a location sensor, a camera, a biometric sensor, etc. Output device(s) 1714 such as a display, speakers, a printer, etc. may also be included. The aforementioned devices are examples and others may be used.

Computing device 1700 may also contain a communication connection 1716 that may allow device 1700 to communicate with other computing devices 1718, such as over a network in a distributed computing environment, for example, an intranet or the Internet. Communication connection 1716 is one example of communication media. Communication media may typically be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer readable media as used herein may include both storage media and communication media.

As stated above, a number of program modules and data files may be stored in system memory 1704, including operating system 1705. While executing on processing unit 1702, programming modules 1706 (e.g., application 1720 such as a OCR application, 3D model creation application) may perform processes including, for example, one or more stages of methods, algorithms, systems, applications, servers, databases as described above. The aforementioned process is an example, and processing unit 1702 may perform other processes. Other programming modules that may be used in accordance with embodiments of the present disclosure may include machine learning applications.

Generally, consistent with embodiments of the disclosure, program modules may include routines, programs, components, data structures, and other types of structures that may perform particular tasks or that may implement particular abstract data types. Moreover, embodiments of the disclosure may be practiced with other computer system configurations, including hand-held devices, general purpose graphics processor-based systems, multiprocessor systems, microprocessor-based or programmable consumer electronics, application specific integrated circuit-based electronics, minicomputers, mainframe computers, and the like. Embodiments of the disclosure may also be practiced in distributed computing environments where tasks are performed by remote processing devices that are linked through a communications network. In a distributed computing environment, program modules may be located in both local and remote memory storage devices.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to mechanical, optical, fluidic, and quantum technologies. In addition, embodiments of the disclosure may be practiced within a general-purpose computer or in any other circuits or systems.

Embodiments of the disclosure, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random-access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, solid state storage (e.g., USB drive), or a CD-ROM, a carrier wave from the Internet, or other forms of RAM or ROM. Further, the disclosed methods' stages may be modified in any manner, including by reordering stages and/or inserting or deleting stages, without departing from the disclosure.

Figure 18:
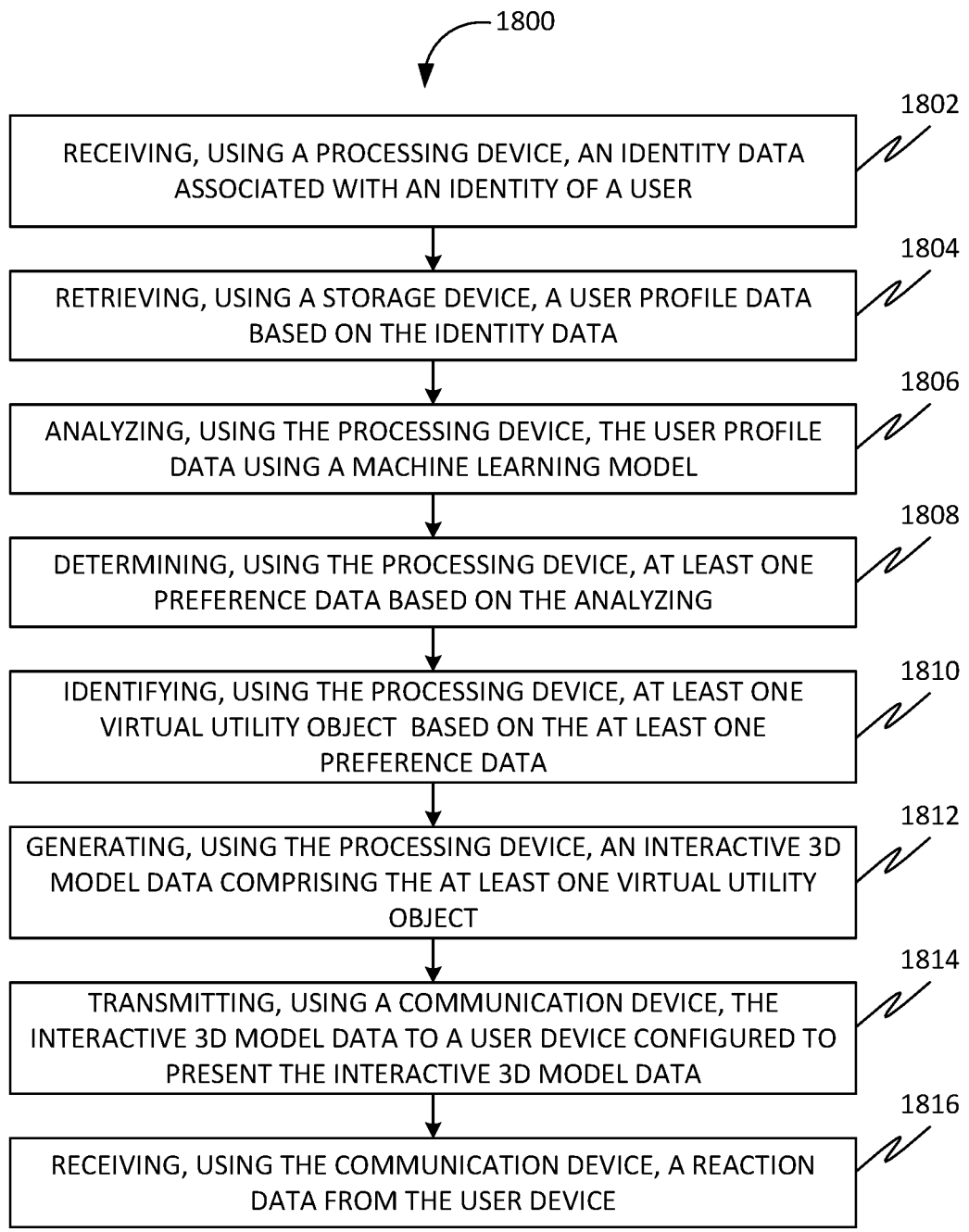
FIG. 18 is a flow chart of a method for provisioning a virtual experience of a building based on user preference, in accordance with some embodiments.

FIG. 18 is a flow chart of a method 1800 for provisioning a virtual experience of a building based on user preference, in accordance with some embodiments. At 1802, the method 1800 may include receiving, using a processing device, an identity data associated with an identity of a user.

Further, at 1804, the method 1800 may include retrieving, using a storage device, a user profile data based on the identity data.

Further, the user profile data may include at least one of a client-side cookie data and a server-side cookie data. Further, the retrieving of the user profile data may include receiving, using the communication device, the client-side cookie data.

Further, at 1806, the method 1800 may include analyzing, using the processing device, the user profile data using a machine learning model.

Further, at 1808, the method 1800 may include determining, using the processing device, at least one preference data based on the analyzing.

Further, at 1810, the method 1800 may include identifying, using the processing device, at least one virtual utility object based on the at least one preference data.

In some embodiments, the identifying may include determining one or more virtual utility objects from an inventory of virtual utility objects. In some other embodiments, the identifying may include identifying a characteristic of a virtual utility object. Accordingly, one or more virtual utility objects may be customized according to the at least one preference data.

Further, at 1812, the method 1800 may include generating, using the processing device, an interactive 3D model data comprising the at least one virtual utility object.

Further, at 1814, the method 1800 may include transmitting, using a communication device, the interactive 3D model data to a user device configured to present the interactive 3D model data.

Further, at 1816, the method 1800 may include receiving, using the communication device, a reaction data from the user device. Further, the user device may include at least one sensor configured to generate the reaction data based on a behavioral reaction of a user consuming the interactive 3D model data. Further, the generating may include updating the interactive 3D model data based on the reaction data.

In some embodiments, the at least one preference data may include at least one media indicator, wherein the method 1800 may further include retrieving, using the communication device, a media file based on the media indicator. Further, the at least one media indicator may include sound, song, music, movie, images etc. Further, the interactive 3D model data may include a virtual media player configured for playing the media file during consumption of the interactive 3D model data by the user. The virtual media player may be a virtual sound system that the user can view within the 3D model as playing a content that is preferred by the user.

Figure 19:
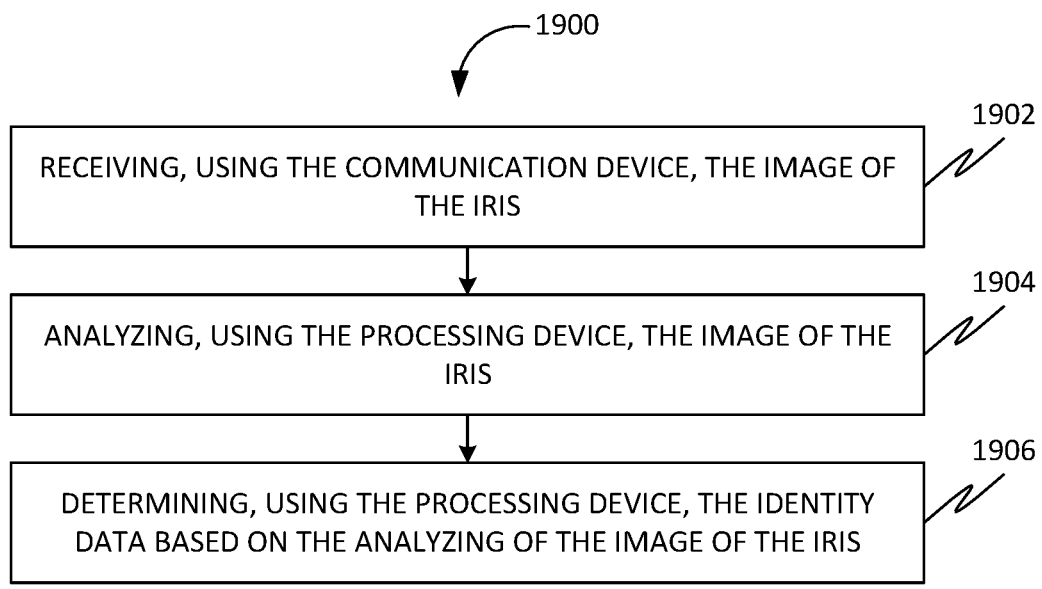
FIG. 19 is a flow chart of a method for provisioning a virtual experience of a building based on user preference, in accordance with some embodiments.

FIG. 19 is a flow chart of a method 1900 for provisioning a virtual experience of a building based on user preference, in accordance with some embodiments. The user device may include a wearable display device comprising an iris detector configured to capture an image of an iris of the user. At 1902, the method 1900 may include receiving, using the communication device, the image of the iris.

Further, at 1904, the method 1900 may include analyzing, using the processing device, the image of the iris.

Further, at 1906, the method 1900 may include determining, using the processing device, the identity data based on the analyzing of the image of the iris.

Figure 20:
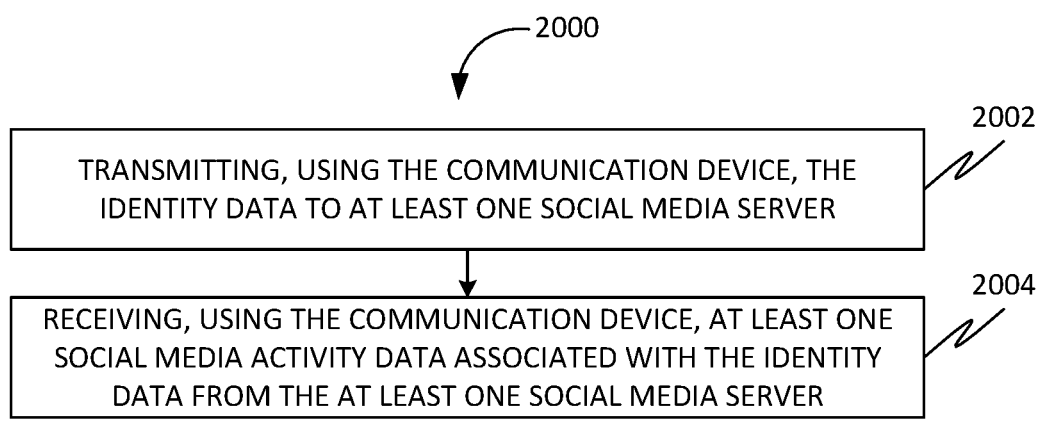
FIG. 20 is a flow chart of a method for retrieving the user profile data, in accordance with some embodiments.

FIG. 20 is a flow chart of a method 2000 for retrieving the user profile data, in accordance with some embodiments. The retrieving (at 1804) the user profile data may include transmitting, using the communication device, the identity data to at least one social media server at 2002.

Further, the retrieving (at 1804) the user profile data may include receiving, using the communication device, at least one social media activity data associated with the identity data from the at least one social media server at 2004. Further, the user profile data may include the at least one social media activity data.

In some embodiments, the social media activity data may include a social reaction data associated with a social media content. Further, the user device may include a physiological detector configured to capture a physiological data of the user based on consumption of the social media content. In further embodiments, the physiological detector may include a pupil detection sensor configured to detect a pupil size of the user's eye.

Figure 21:
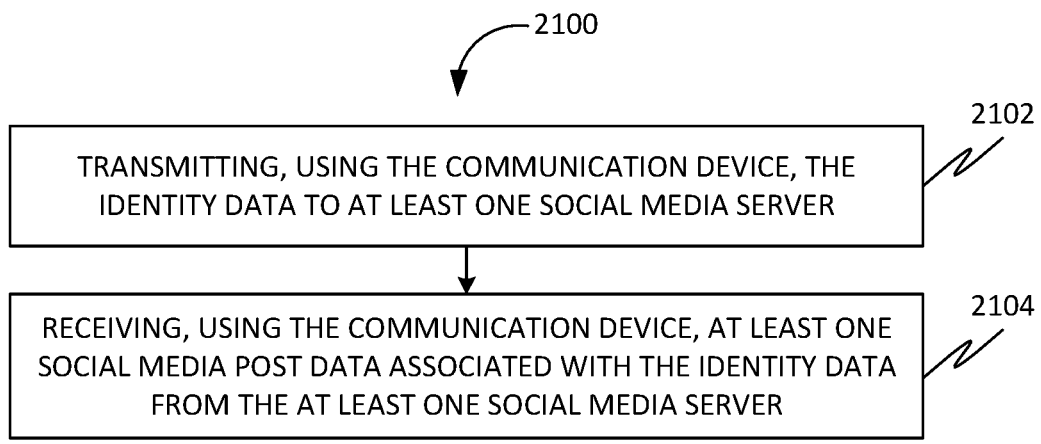
FIG. 21 is a flow chart of a method for retrieving the user profile data, in accordance with some embodiments.

FIG. 21 is a flow chart of a method 2100 for retrieving the user profile data, in accordance with some embodiments. The retrieving (at 1804) the user profile data may include transmitting, using the communication device, the identity data to at least one social media server at 2102.

Further, the retrieving (at 1804) the user profile data may include receiving, using the communication device, at least one social media post data associated with the identity data from the at least one social media server at 2104. Further, the user profile data may include the at least one social media post data. Further, the analyzing (at 1806) may include performing object recognition. Further, the at least one preference data may include a preferred wall art data. Further, the interactive 3D model data may include at least one virtual wall art based on the preferred wall art data.

In some embodiments, the preferred wall art data may include any paintings or other such wall mounted structures that is visibly displayed in the user's social media posts (indicating an inherent pride or likeness towards such wall art) and replicate such wall art within the 3D model. This exploits the same principle that businesses use in offering trial use of an object causing the buyer to form an emotional connect with the product and making it difficult to give up at the end of trial period. Accordingly, seeing such familiar or previously owned/liked wall art on the walls may give the user a sense of belongingness of the virtual home making closure more probable.

Figure 22:
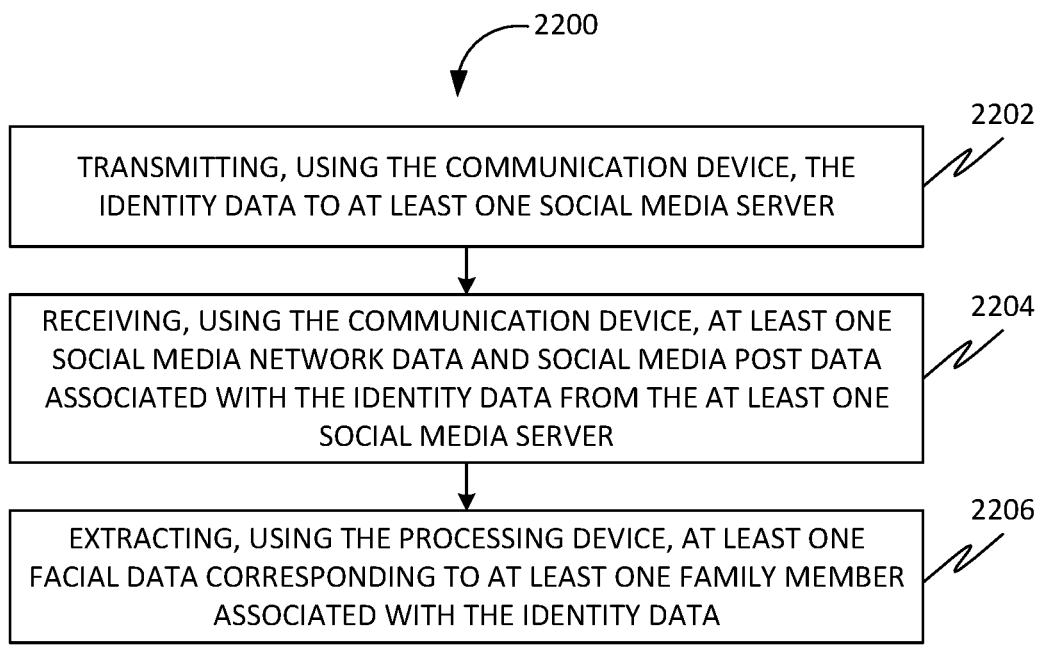
FIG. 22 is a flow chart of a method for retrieving the user profile data, in accordance with some embodiments.

FIG. 22 is a flow chart of a method 2200 for retrieving the user profile data, in accordance with some embodiments. The retrieving (at 1804) the user profile data may include transmitting, using the communication device, the identity data to at least one social media server at 2202.

Further, the retrieving (at 1804) the user profile data may include receiving, using the communication device, at least one social media network data and social media post data associated with the identity data from the at least one social media server at 2204.

Further, the retrieving (at 1804) the user profile data may include extracting, using the processing device, at least one facial data corresponding to at least one family member associated with the identity data at 2206. Further, the analyzing (at 1806) may include performing face recognition. Further, the generating of the interactive 3D model data may include generating at least one avatar based on the at least one facial data and animating the at least one avatar in relation to at least one virtual utility object. This feature may be used to show friends, family members having a good time in the house (potentially along with a user) while the user watches as a third person.

In some embodiments, the at least one preference data may include a preferred activity data. Further, the generating of the interactive 3D model data may include generating at least one self-avatar based on the user profile data and animating the at least one self-avatar in relation to at least one virtual utility object based on the preferred activity data. This feature may be used to show a user as doing something like himself (for example, playing a piano).

Figure 23:
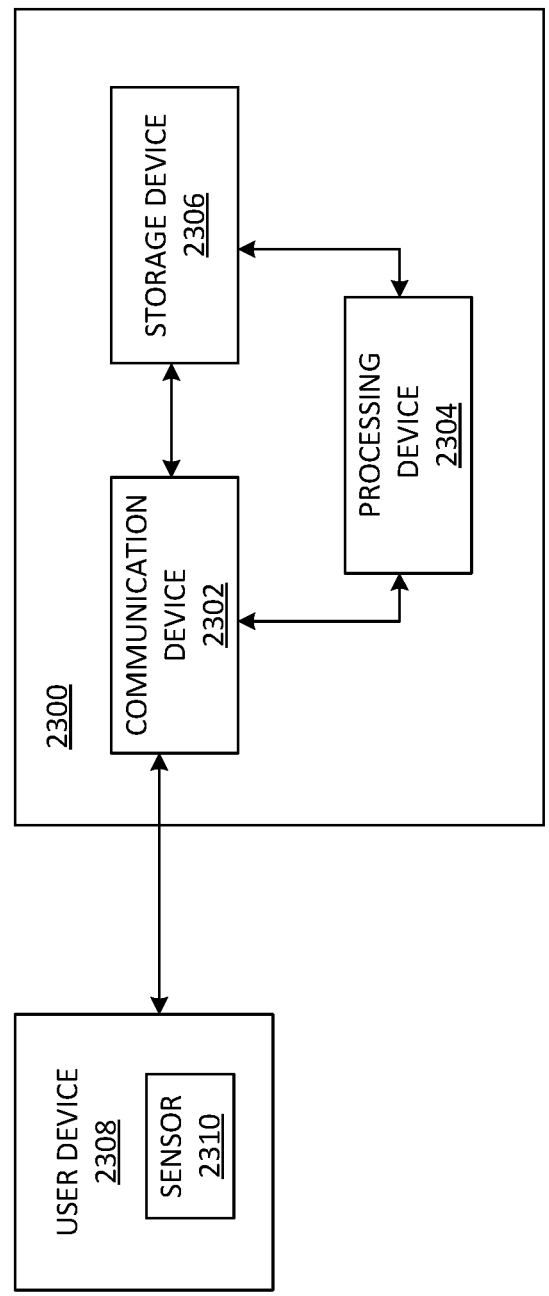
FIG. 23 is a block diagram of a system for provisioning a virtual experience of a building based on user preference, in accordance with some embodiments.

FIG. 23 is a block diagram of a system 2300 for provisioning a virtual experience of a building based on user preference, in accordance with some embodiments. The system 2300 may include a communication device 2302, a processing device 2304 and a storage device 2306.

The processing device 2304 may be configured for analyzing a user profile data using a machine learning model.

Further, the processing device 2304 may be configured for determining at least one preference data based on the analyzing.

Further, the processing device 2304 may be configured for identifying at least one virtual utility object based on the at least one preference data.

Further, the processing device 2304 may be configured for generating an interactive 3D model data comprising the at least one virtual utility object.

The storage device 2306 may be configured for retrieving the user profile data based on an identity data.

The communication device 2302 may be configured for receiving the identity data associated with an identity of a user.

Further, the communication device 2302 may be configured for transmitting the interactive 3D model data to a user device 2308 configured to present the interactive 3D model data.

Further, the communication device 2302 may be configured for receiving a reaction data from the user device 2308. Further, the user device 2308 may include at least one sensor 2310 configured to generate the reaction data based on a behavioral reaction of a user consuming the interactive 3D model data. Further, the generating may include updating the interactive 3D model data based on the reaction data.

Further, the user device 2308 may include a wearable display device comprising an iris detector configured to capture an image of an iris of the user. Further, the communication device 2302 may be configured for receiving the image of the iris. Further, the processing device 2304 may be configured for analyzing the image of the iris and determining the identity data based on the analyzing of the image of the iris.

Further, the communication device 2302 may be configured for transmitting the identity data to at least one social media server and receiving at least one social media activity data associated with the identity data from the at least one social media server. Further, the user profile data may include the at least one social media activity data.

Further, the social media activity data may include a social reaction data associated with a social media content. Further, the user device 2308 may include a physiological detector configured to capture a physiological data of the user based on consumption of the social media content.

Further, the physiological detector may include a pupil detection sensor configured to detect a pupil size of the user's eye.

Further, the at least one preference data may include at least one media indicator. Further, the system 2300 may be configured retrieving a media file based on the media indicator. Further, the interactive 3D model data may include a virtual media player configured for playing the media file during consumption of the interactive 3D model data by the user.

Further, the communication device 2302 may be configured for transmitting the identity data to at least one social media server and receiving at least one social media post data associated with the identity data from the at least one social media server. Further, the user profile data may include the at least one social media post data. Further, the analyzing may include performing object recognition. Further, the at least one preference data may include a preferred wall art data. Further, the interactive 3D model data may include at least one virtual wall art based on the preferred wall art data.

Further, the communication device 2302 may be configured for transmitting the identity data to at least one social media server and receiving at least one social media network data and social media post data associated with the identity data from the at least one social media server. Further, the processing device 2304 may be configured for extracting at least one facial data corresponding to at least one family member associated with the identity data. Further, the analyzing may include performing face recognition. Further, the generating of the interactive 3D model data may include generating at least one avatar based on the at least one facial data and animating the at least one avatar in relation to at least one virtual utility object.

Further, the at least one preference data may include a preferred activity data. Further, the generating of the interactive 3D model data may include generating at least one self-avatar based on the user profile data and animating the at least one self-avatar in relation to at least one virtual utility object based on the preferred activity data.

Further, the user profile data may include at least one of a client-side cookie data and a server-side cookie data. Further, the retrieving of the user profile data may include receiving the client-side cookie data.

Although the present disclosure has been explained in relation to its preferred embodiment, it is to be understood that many other possible modifications and variations can be made without departing from the spirit and scope of the disclosure.

We claim:

1. A method of provisioning a virtual experience of a building based on user preference, the method comprising:
   receiving, using a processing device, an identity data associated with an identity of a user;
   retrieving, using a storage device, a user profile data based on the identity data;
   analyzing, using the processing device, the user profile data using a machine learning model;
   determining, using the processing device, at least one preference data based on the analyzing;
   identifying, using the processing device, at least one virtual utility object based on the at least one preference data;
   generating, using the processing device, an interactive 3D model data comprising the at least one virtual utility object;
   transmitting, using a communication device, the interactive 3D model data to a user device configured to present the interactive 3D model data; and
   receiving, using the communication device, a reaction data from the user device, wherein the user device comprises at least one sensor configured to generate the reaction data based on a behavioral reaction of a user consuming the interactive 3D model data, wherein the generating comprises updating the interactive 3D model data based on the reaction data.

2. The method of claim 1, wherein the user device comprises a wearable display device comprising an iris detector configured to capture an image of an iris of the user, wherein the receiving comprises:
   receiving, using the communication device, the image of the iris;
   analyzing, using the processing device, the image of the iris; and
   determining, using the processing device, the identity data based on the analyzing of the image of the iris.

3. The method of claim 1, wherein retrieving the user profile data comprises:
   transmitting, using the communication device, the identity data to at least one social media server; and
   receiving, using the communication device, at least one social media activity data associated with the identity data from the at least one social media server, wherein the user profile data comprises the at least one social media activity data.

4. The method of claim 3, wherein the social media activity data comprises a social reaction data associated with a social media content, wherein the user device comprises a physiological detector configured to capture a physiological data of the user based on consumption of the social media content.

5. The method of claim 4, wherein the physiological detector comprises a pupil detection sensor configured to detect a pupil size of the user's eye.

6. The method of claim 1, wherein the at least one preference data comprises at least one media indicator, wherein the method further comprises retrieving, using the communication device, a media file based on the media indicator, wherein the interactive 3D model data comprises a virtual media player configured for playing the media file during consumption of the interactive 3D model data by the user.

7. The method of claim 1, wherein retrieving the user profile data comprises:
   transmitting, using the communication device, the identity data to at least one social media server; and
   receiving, using the communication device, at least one social media post data associated with the identity data from the at least one social media server, wherein the user profile data comprises the at least one social media post data, wherein the analyzing comprises performing object recognition, wherein the at least one preference data comprises a preferred wall art data, wherein the interactive 3D model data comprises at least one virtual wall art based on the preferred wall art data.

8. The method of claim 1, wherein retrieving the user profile data comprises:
   transmitting, using the communication device, the identity data to at least one social media server;
   receiving, using the communication device, at least one social media network data and social media post data associated with the identity data from the at least one social media server; and
   extracting, using the processing device, at least one facial data corresponding to at least one family member associated with the identity data, wherein the analyzing comprises performing face recognition, wherein the generating of the interactive 3D model data comprises generating at least one avatar based on the at least one facial data and animating the at least one avatar in relation to at least one virtual utility object.

9. The method of claim 1, wherein the at least one preference data comprises a preferred activity data, wherein the generating of the interactive 3D model data comprises generating at least one self-avatar based on the user profile data and animating the at least one self-avatar in relation to at least one virtual utility object based on the preferred activity data.

10. The method of claim 1, wherein the user profile data comprises at least one of a client-side cookie data and a server-side cookie data, wherein the retrieving of the user profile data comprises receiving, using the communication device, the client-side cookie data.

11. A system for provisioning a virtual experience of a building based on user preference, the system comprising:
    a processing device configured for:
       analyzing a user profile data using a machine learning model;
       determining at least one preference data based on the analyzing;
       identifying at least one virtual utility object based on the at least one preference data; and
       generating an interactive 3D model data comprising the at least one virtual utility object;
    a storage device configured for retrieving the user profile data based on an identity data; and
    a communication device configured for:

receiving the identity data associated with an identity of a user;

transmitting the interactive 3D model data to a user device configured to present the interactive 3D model data; and receiving a reaction data from the user device, wherein the user device comprises at least one sensor configured to generate the reaction data based on a behavioral reaction of a user consuming the interactive 3D model data, wherein the generating comprises updating the interactive 3D model data based on the reaction data.

12. The system of claim 11, wherein the user device comprises a wearable display device comprising an iris detector configured to capture an image of an iris of the user, wherein the communication device is further configured for receiving the image of the iris, wherein the processing device is further configured for:

analyzing the image of the iris; and determining the identity data based on the analyzing of the image of the iris.

13. The system of claim 11, wherein the communication device is further configured for:

transmitting the identity data to at least one social media server; and receiving at least one social media activity data associated with the identity data from the at least one social media server, wherein the user profile data comprises the at least one social media activity data.

14. The system of claim 13, wherein the social media activity data comprises a social reaction data associated with a social media content, wherein the user device comprises a physiological detector configured to capture a physiological data of the user based on consumption of the social media content.

15. The system of claim 14, wherein the physiological detector comprises a pupil detection sensor configured to detect a pupil size of the user's eye.

16. The system of claim 11, wherein the at least one preference data comprises at least one media indicator, wherein the system further comprises retrieving a media file based on the media indicator, wherein the interactive 3D model data comprises a virtual media player configured for playing the media file during consumption of the interactive 3D model data by the user.

17. The system of claim 11, wherein the communication device is further configured for:

transmitting the identity data to at least one social media server; and receiving at least one social media post data associated with the identity data from the at least one social media server, wherein the user profile data comprises the at least one social media post data, wherein the analyzing comprises performing object recognition, wherein the at least one preference data comprises a preferred wall art data, wherein the interactive 3D model data comprises at least one virtual wall art based on the preferred wall art data.

18. The system of claim 11, wherein the communication device is further configured for:

transmitting the identity data to at least one social media server; and receiving at least one social media network data and social media post data associated with the identity data from the at least one social media server, wherein the processing device is configured for extracting at least one facial data corresponding to at least one family member associated with the identity data, wherein the analyzing comprises performing face recognition, wherein the generating of the interactive 3D model data comprises generating at least one avatar based on the at least one facial data and animating the at least one avatar in relation to at least one virtual utility object.

19. The system of claim 11, wherein the at least one preference data comprises a preferred activity data, wherein the generating of the interactive 3D model data comprises generating at least one self-avatar based on the user profile data and animating the at least one self-avatar in relation to at least one virtual utility object based on the preferred activity data.

20. The system of claim 11, wherein the user profile data comprises at least one of a client-side cookie data and a server-side cookie data, wherein the retrieving of the user profile data comprises receiving the client-side cookie data.

* * * * *